(12) United States Patent
Magureanu et al.

(10) Patent No.: US 11,379,092 B2
(45) Date of Patent: Jul. 5, 2022

(54) DYNAMIC LOCATION AND EXTRACTION OF A USER INTERFACE ELEMENT STATE IN A USER INTERFACE THAT IS DEPENDENT ON AN EVENT OCCURRENCE IN A DIFFERENT USER INTERFACE

(71) Applicant: Klarna Bank AB, Stockholm (SE)

(72) Inventors: Stefan Magureanu, Solna (SE);
Marcus Näslund, Uppsala (SE);
Andrey Melentyev, Stockholm (SE);
Henrik Ståhl, Stockholm (SE);
Stanislav Dzhumaev, Stockholm (SE)

(73) Assignee: Klarna Bank AB, Stockholm (SE)

( * ) Notice: Subject to any disclaimer, the term of this patent is extended or adjusted under 35 U.S.C. 154(b) by 0 days.

(21) Appl. No.: 16/680,392

(22) Filed: Nov. 11, 2019

(65) Prior Publication Data
US 2021/0141497 A1 May 13, 2021

(51) Int. Cl.
*G06F 3/0482* (2013.01)
*G06K 9/62* (2022.01)
*G06F 30/20* (2020.01)

(52) U.S. Cl.
CPC ............ *G06F 3/0482* (2013.01); *G06F 30/20* (2020.01); *G06K 9/623* (2013.01); *G06K 9/6268* (2013.01)

(58) Field of Classification Search
CPC .......... G06Q 10/06; G06Q 30/00; G06F 8/38; G06F 8/35; G06F 17/2247; G06F 17/22;
(Continued)

(56) References Cited

U.S. PATENT DOCUMENTS 6,073,163 A   6/2000 Clark et al.
6,346,953 B1  2/2002 Erlikh et al.
(Continued)

FOREIGN PATENT DOCUMENTS

CN   105955889 A   9/2016
CN   112287273 A   1/2021
(Continued)

OTHER PUBLICATIONS

Amazon Web Services, "AWS KMS keys concepts," AWS Key Management Service Developer Guide, first disclosed Nov. 12, 2014, latest update Aug. 30, 2021, https://docs.aws.amazon.com/kms/latest/developerguide/concepts.html, 21 pages.
(Continued)

*Primary Examiner* — Steven P Sax
(74) *Attorney, Agent, or Firm* — Davis Wright Tremaine LLP

(57) ABSTRACT

A first interface is accessed. Initial data of a second interface different from the first interface is obtained. A first object in the first interface that is associated with a first value is engaged. Refreshed data of the second interface is obtained. A correlation between the first value and a second object in the refreshed data of the second interface is determined at least in part as a result of a difference between the initial data and the refreshed data corresponding to the first value. That the second object is a final object and the second interface is a final interface is determined based on the correlation. Integration code is generated based on a location of the final object in the second interface, where the integration code causes the device to engage the first object and engage a second object in the first interface to execute the final interface.

12 Claims, 13 Drawing Sheets

(58) Field of Classification Search
CPC .. G06F 3/04812; G06F 3/0484; G06F 3/0488; G06F 3/0482; G06F 30/20; G06K 9/623; G06K 9/6268
See application file for complete search history.

(56) References Cited

U.S. PATENT DOCUMENTS

| | | | |
|---|---|---|---|
| 7,788,590 B2 | 8/2010 | Taboada et al. | |
| 8,396,903 B2* | 3/2013 | Jellum | G06Q 10/06 707/804 |
| 8,775,923 B1 | 7/2014 | Kroeger et al. | |
| 8,812,546 B1 | 8/2014 | Cornali | |
| 8,886,669 B2* | 11/2014 | Limber | G06F 16/168 707/781 |
| 9,252,962 B1 | 2/2016 | Valeti | |
| 9,600,401 B1 | 3/2017 | Haischt et al. | |
| 9,753,898 B1 | 9/2017 | Glommen et al. | |
| 9,836,781 B2* | 12/2017 | Potucek | G06F 3/0673 |
| 9,946,895 B1 | 4/2018 | Kruse et al. | |
| 9,959,027 B1 | 5/2018 | Gajulapally et al. | |
| 10,043,255 B1 | 8/2018 | Pathapati et al. | |
| 10,121,176 B2 | 11/2018 | Buezas et al. | |
| 10,152,552 B2* | 12/2018 | Simpson | G06F 8/38 |
| 10,649,864 B1 | 5/2020 | Parikh et al. | |
| 10,748,035 B2 | 8/2020 | Lee | |
| 10,816,978 B1 | 10/2020 | Schwalb | |
| 2002/0063734 A1 | 5/2002 | Khalfay et al. | |
| 2004/0216044 A1* | 10/2004 | Martin | G06F 40/143 715/273 |
| 2006/0101392 A1 | 5/2006 | Isaza | |
| 2007/0073758 A1 | 3/2007 | Perry et al. | |
| 2007/0132779 A1* | 6/2007 | Gilbert | G05B 19/41885 345/619 |
| 2007/0300145 A1 | 12/2007 | Perelman et al. | |
| 2009/0193250 A1 | 7/2009 | Yokota et al. | |
| 2009/0319342 A1 | 12/2009 | Shilman et al. | |
| 2010/0175050 A1 | 7/2010 | Wang et al. | |
| 2010/0191582 A1* | 7/2010 | Dicker | G06Q 30/0633 705/14.51 |
| 2010/0306249 A1* | 12/2010 | Hill | G06Q 50/01 707/769 |
| 2011/0106732 A1 | 5/2011 | Chidlovskii | |
| 2011/0126158 A1 | 5/2011 | Fogarty et al. | |
| 2011/0289489 A1 | 11/2011 | Kumar et al. | |
| 2011/0302487 A1 | 12/2011 | McCormack et al. | |
| 2012/0084770 A1* | 4/2012 | Kriebel | G06Q 10/00 717/174 |
| 2012/0089933 A1* | 4/2012 | Garand | G06F 8/38 715/765 |
| 2012/0174069 A1 | 7/2012 | Zavatone | |
| 2012/0290428 A1* | 11/2012 | Ben-Bassat | G06Q 30/06 705/26.5 |
| 2013/0095864 A1 | 4/2013 | Marovets | |
| 2014/0173415 A1* | 6/2014 | Kattil Cherian | H04L 41/069 715/234 |
| 2014/0222616 A1 | 8/2014 | Siemiatkowski et al. | |
| 2014/0372867 A1 | 12/2014 | Tidhar et al. | |
| 2015/0082280 A1 | 3/2015 | Betak et al. | |
| 2015/0088650 A1 | 3/2015 | Taylor et al. | |
| 2015/0113477 A1* | 4/2015 | Haussila | G06F 3/04883 715/810 |
| 2015/0264107 A1 | 9/2015 | Harz et al. | |
| 2015/0278779 A1 | 10/2015 | Pfeifer | |
| 2016/0065370 A1 | 3/2016 | Le Saint et al. | |
| 2016/0080157 A1 | 3/2016 | Lundstrom | |
| 2016/0125371 A1 | 5/2016 | Grassadonia et al. | |
| 2016/0155165 A1 | 6/2016 | Babar et al. | |
| 2016/0180318 A1 | 6/2016 | Brooks | |
| 2016/0188145 A1* | 6/2016 | Vida | B60K 37/06 715/745 |
| 2016/0239870 A1 | 8/2016 | Mishra et al. | |
| 2016/0328984 A1 | 11/2016 | Ben-Naim | |
| 2016/0370956 A1* | 12/2016 | Penha | G11B 27/36 |
| 2016/0379220 A1 | 12/2016 | Tunnell et al. | |
| 2017/0011441 A1 | 1/2017 | Buezas et al. | |
| 2017/0024721 A1 | 1/2017 | Joson et al. | |
| 2017/0038846 A1 | 2/2017 | Minnen et al. | |
| 2017/0090690 A1 | 3/2017 | Chor | |
| 2017/0124053 A1 | 5/2017 | Campbell et al. | |
| 2017/0161822 A1 | 6/2017 | Crogan et al. | |
| 2017/0168996 A1 | 6/2017 | Dou et al. | |
| 2017/0337116 A1* | 11/2017 | Negara | G06F 11/3664 |
| 2017/0353422 A1 | 12/2017 | Ghosh et al. | |
| 2017/0372408 A1 | 12/2017 | Khandelwal et al. | |
| 2018/0024915 A1 | 1/2018 | Taneja | |
| 2018/0047038 A1 | 2/2018 | DeLuca et al. | |
| 2018/0158037 A1 | 6/2018 | Cassel et al. | |
| 2018/0174212 A1 | 6/2018 | Lauka et al. | |
| 2018/0210428 A1* | 7/2018 | Jundt | G06K 7/10366 |
| 2018/0335939 A1* | 11/2018 | Karunamuni | G06F 8/38 |
| 2018/0336574 A1 | 11/2018 | Mohan et al. | |
| 2018/0350144 A1* | 12/2018 | Rathod | G06Q 20/3276 |
| 2018/0357729 A1 | 12/2018 | Farnham et al. | |
| 2019/0007508 A1 | 1/2019 | Xu et al. | |
| 2019/0114059 A1 | 4/2019 | Chakra et al. | |
| 2019/0114061 A1* | 4/2019 | Daniels | G06F 3/04815 |
| 2019/0158994 A1 | 5/2019 | Gross et al. | |
| 2019/0205773 A1* | 7/2019 | Ackerman | G06F 21/6227 |
| 2019/0259293 A1 | 8/2019 | Hellman et al. | |
| 2019/0272540 A1 | 9/2019 | Wells et al. | |
| 2019/0294642 A1 | 9/2019 | Matlick et al. | |
| 2019/0384699 A1 | 12/2019 | Arbon et al. | |
| 2020/0007487 A1 | 1/2020 | Chao et al. | |
| 2020/0074448 A1 | 3/2020 | Isaacson et al. | |
| 2020/0089813 A1* | 3/2020 | Chauhan | G06F 9/453 |
| 2020/0089912 A1 | 3/2020 | Mital et al. | |
| 2020/0125635 A1 | 4/2020 | Nuolf et al. | |
| 2020/0134388 A1 | 4/2020 | Rohde | |
| 2020/0201689 A1 | 6/2020 | Laethem | |
| 2020/0242669 A1 | 7/2020 | Carroll et al. | |
| 2020/0306959 A1 | 10/2020 | Huang et al. | |
| 2020/0394396 A1 | 12/2020 | Yanamandra et al. | |
| 2020/0409668 A1* | 12/2020 | Eberlein | G06F 11/3447 |
| 2020/0410062 A1 | 12/2020 | O'Malley | |
| 2020/0410063 A1 | 12/2020 | O'Malley | |
| 2021/0044491 A1* | 2/2021 | Shah | H04L 67/1095 |
| 2021/0090449 A1 | 3/2021 | Smith et al. | |
| 2021/0267688 A1* | 9/2021 | Chacon Quiros | G06F 30/20 |
| 2021/0287130 A1 | 9/2021 | Kalluri | |

FOREIGN PATENT DOCUMENTS

| | | |
|---|---|---|
| WO | 2014204862 A1 | 12/2014 |
| WO | 2018053863 A1 | 3/2018 |
| WO | 2019171163 A1 | 9/2019 |
| WO | 2020069387 A1 | 4/2020 |

OTHER PUBLICATIONS

Gur et al., "Adversarial Environment Generation for Learning to Navigate the Web," Deep RL Workshop, NeurIPS 2020, Mar. 2, 2021, 14 pages.

Gur et al., "Learning to Navigate the Web," International Conference on Learning Representations (ICLR) 2019, Dec. 21, 2018, 12 pages.

Hou et al., "Malicious web content detection by machine learning," Expert Systems With Applications 37(1):55-60, Jan. 1, 2010.

International Search Report and Written Opinion dated Apr. 6, 2021, Patent Application No. PCT/IB2021/050169, 15 pages.

International Search Report and Written Opinion dated Feb. 16, 2021, Patent Application No. PCT/IB2020/060585, 16 pages.

International Search Report and Written Opinion dated Jun. 9, 2021, Patent Application No. PCT/IB2021/052415, 15 pages.

International Search Report and Written Opinion dated May 25, 2021, Patent Application No. PCT/IB2021/051913, 13 pages.

Memon et al., "GUI Ripping: Reverse Engineering of Graphical User Interfaces for Testing," Proceedings of the 10th Working Conference on Reverse Engineering (WCRE '03), Nov. 2003, 10 pages.

(56) References Cited

OTHER PUBLICATIONS

Wikipedia, "k-means clustering," Wikipedia the Free Encyclopedia, last edited Jun. 25, 2020 (retrieved Jul. 9, 2020), https://en.wikipedia.org/wiki/k-means_clustering, 16 pages.
Wikipedia, "MHTML," Wikipedia the Free Encyclopedia, last edited Apr. 29, 2021, https://en.wikipedia.org/wiki/MHTML, 6 pages.
Wikipedia, "X.509," Wikipedia Encyclopedia, Aug. 16, 2018, retrieved May 13, 2020, from https://web.archive.org/web/20180816222554/https://en.wikipedia.org/wiki/X.509, 16 pages.
U.S. Appl. No. 16/680,396, filed Nov. 11, 2019.
U.S. Appl. No. 16/680,403, filed Nov. 11, 2019.
U.S. Appl. No. 16/680,406, filed Nov. 11, 2019.
U.S. Appl. No. 16/680,408, filed Nov. 11, 2019.
U.S. Appl. No. 16/680,410, filed Nov. 11, 2019.
U.S. Appl. No. 16/744,017, filed Jan. 15, 2020.
U.S. Appl. No. 16/813,531, filed Mar. 9, 2020.
U.S. Appl. No. 16/744,021, filed Jan. 15, 2020.
U.S. Appl. No. 16/837,956, filed Apr. 1, 2020.
U.S. Appl. No. 17/173,132, filed Feb. 10, 202.
U.S. Appl. No. 17/318,946, filed May 12, 2021.
Second Written Opinion of the International Preliminary Examining Authority dated Oct. 26, 2021, Patent Application No. PCT/IB2020/060585, 9 pages.
Nasraoui et al., "Human-Algorith Interaction Biases in the Big Data Cycle: A Markov Chain Iterated Learning Framework," arXiv preprint arXiv: 1608.07895, Aug. 29, 2016, 9 pages.
IP.com, "Method and system for using data analytics to leverage consumer purchasing patterns to support charity organizations," IP.com, Sep. 11, 2014, Prior Art Database Technical Disclosure, IP.com No. IPCOM000238684D, 4 pages.

\* cited by examiner

DYNAMIC LOCATION AND EXTRACTION OF A USER INTERFACE ELEMENT STATE IN A USER INTERFACE THAT IS DEPENDENT ON AN EVENT OCCURRENCE IN A DIFFERENT USER INTERFACE

CROSS REFERENCE TO RELATED APPLICATION

This application incorporates by reference for all purposes the full disclosure of co-pending U.S. patent application Ser. No. 16/680 396, filed concurrently herewith, entitled "UNSUPERVISED LOCATION AND EXTRACTION OF OPTION ELEMENTS IN A USER INTERFACE", U.S. patent application Ser. No. 16/680,403, filed concurrently herewith, entitled "DYNAMIC IDENTIFICATION OF USER INTERFACE ELEMENTS THROUGH UNSUPERVISED EXPLORATION", U.S. patent application Ser. No. 16/680,406, filed concurrently herewith, entitled "LOCATION AND EXTRACTION OF ITEM ELEMENTS IN A USER INTERFACE", U.S. patent application Ser. No. 16/680 408, filed concurrently herewith, entitled "UNSUPERVISED LOCATION AND EXTRACTION OF QUANTITY AND UNIT VALUE ELEMENTS IN A USER INTERFACE", and U.S. application Ser. No. 16/680,410, filed concurrently herewith, entitled "EXTRACTION AND RESTORATION OF OPTION SELECTIONS IN A USER INTERFACE".

BACKGROUND

In many contexts, users may interact with various interfaces of service providers. Users may desire to perform various processes with regards to the services of the service providers. A user is often required to complete complicated and complex processes to interact with a service provider using various interfaces. Furthermore, if the user begins the interaction process and wishes to complete at a later date, the user often has to restart the process from the beginning. Still further, the user may desire to but be unable to share configured interfaces with other users. Providing users with the ability to streamline such processes presents a challenge, especially because the various service providers often have their own particular implementations of their interfaces involving large amounts of sub-processes and other complexities.

BRIEF DESCRIPTION OF THE DRAWINGS

Various techniques will be described with reference to the drawings, in which.

DETAILED DESCRIPTION

Figure 1:
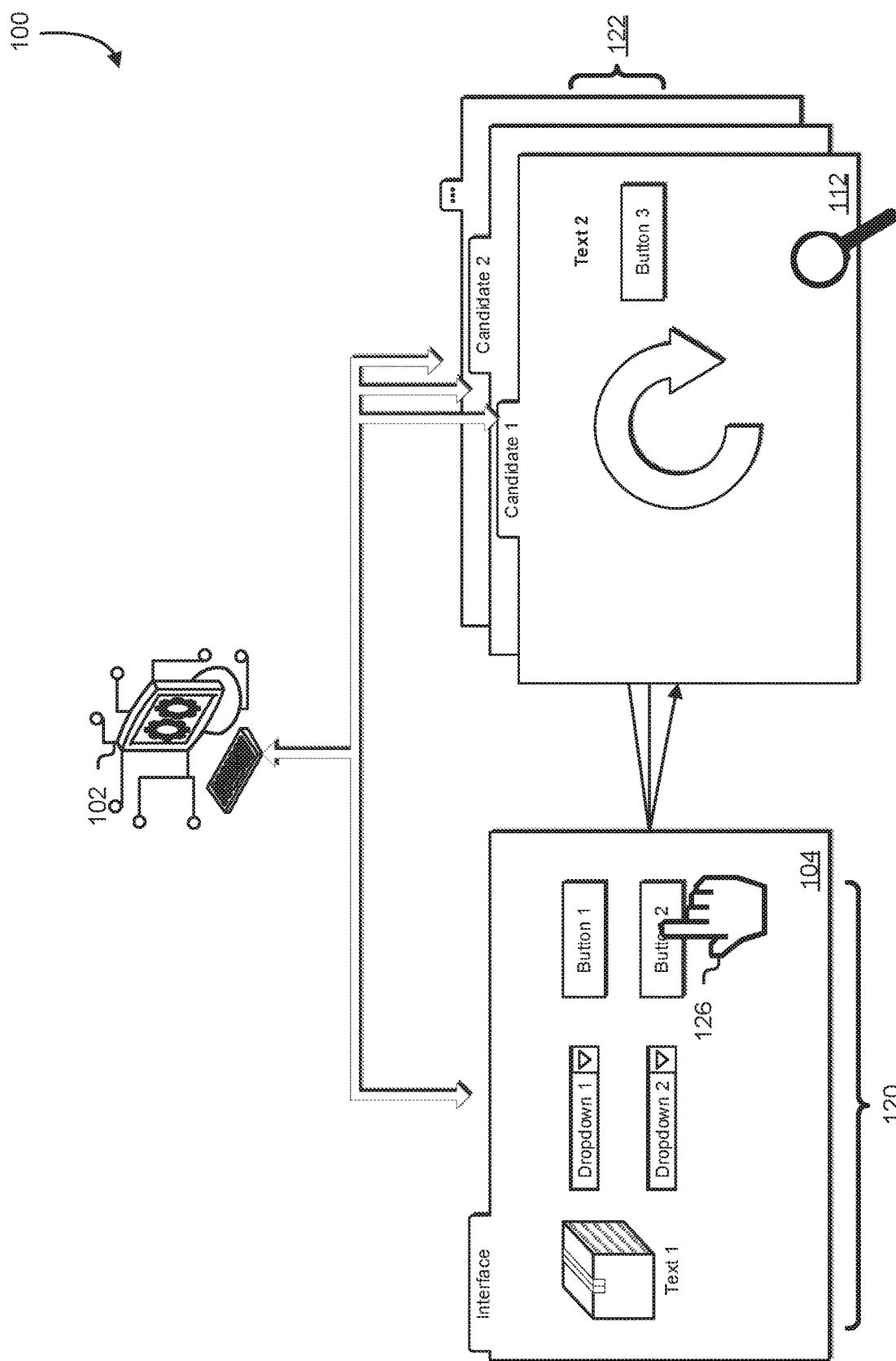
FIG. 1 illustrates an example of dynamic identification of user interface elements through unsupervised exploration in accordance with an embodiment.

Techniques and systems described herein relate to providing users of various services, which may interact with the users through various interfaces, with integration code that can model and/or streamline various processes and functionalities of the various interfaces. Users may interact with various services using the integration code to streamline the interactions and increase efficiency. An integration code may provide various technological advantages, such as the ability for a user device to streamline interactions with service providers without having to burden the user with navigating potentially complex interfaces of the service providers.

To illustrate, in a first example, user interface source code is obtained. In this example, a particular object in the user interface source code is located by at least identifying a set of objects in the user interface source code, passing each of the set of objects as input to a machine learning classifier to determine a set of candidate interface objects for the particular object, and, for each candidate interface object of the set of candidate interface objects, simulating human interaction with the candidate interface object, detecting a result of simulating the human interaction, and modifying a ranking of the set of candidate interface objects based on the result to produce a modified set of candidate interface objects.

Continuing with the first example, the particular object is determined, based on the ranking from the modified set of candidate interface objects. Still further in the example, a user interface is caused to be displayed on a client device. Finally, in the example, the human interaction with the particular candidate interface object is simulated as a result of a selection made via the user interface. In the context of the present disclosure, the term "user interface" is contemplated to include a graphical user interface or other types of interface provided to a user for interaction with interface elements.

To further illustrate, in a second example, a set of first button object candidates in a first user interface is determined. In this example, a set of second button object candidates in the first user interface is also determined, with the set of second button object candidates being associated with a respective set of values. Still in this example, a set of candidate user interfaces is executed by simulating human interaction with the set of first button object candidates.

Continuing with the second example, a set of candidate rankings is produced by at least, for each second button object of the set of second button object candidates storing a set of respective initial states of the set of candidate user interfaces, simulating the human interaction with the second button object, refreshing the set of candidate user interfaces, and, for each candidate user interface of the set of candidate user interfaces, on a condition that a difference between a respective initial state of the candidate user interface and a current state of the candidate user interface has a correlation to a respective value associated with the second button object, increasing candidate rankings of the second button object and the candidate user interface.

Continuing further with the second example, a principal second button object of the set of second button object candidates and a principal user interface of the set of candidate user interfaces are designated based on the set of candidate rankings. Still in this example, integration code is generated based on metadata of the principal second button, the principal user interface, and a corresponding first button object that executed the principal user interface. Finally, in the second example, the integration code is provided to a client device to cause, as a result of execution of the integration code by the client device, the client device to execute the first user interface, simulate the human interaction with the principal second button object, and simulate the human interaction with the corresponding first button object to execute the principal user interface.

To still further illustrate, in a third example, a first user interface having a first interface object, a second interface object, and a third interface object is executed, with the third interface object being associated with a first option element and a second option element. In the example, the third interface object is set to the first option element. Still in the example, human interaction is simulated with the second interface object a first time.

Continuing with the third example, the second user interface is executed as a result of simulating the human interaction with the first interface object, with the second user interface being in a first state that includes a first listed selection corresponding to the first option element. Further in the example, the third interface object is set to the second option element. In the example, the human interaction is simulated with the second interface object a second time.

Continuing further with the third example, the second user interface is refreshed to produce the second user interface in a second state. Still in the example, integration code is generated as a result of verifying that a difference between the second state and the first state includes a second listed selection corresponding to the second option element. Finally in the example, one of the first option element or the second option element of the third interface object of the first user interfaces is selected a result of execution of the integration code by a client device.

To still further illustrate, in a fourth example, a first user interface having a first button object and a second button object is executed, with the first button object being associated with a value, a label, and a digital image. In the example, human interaction is simulated with the first button object. Also in the example, a second user interface is executed as a result of simulating the human interaction with the second button object.

Continuing with the fourth example, the second user interface is identified to include an occurrence of the label. Further in the example, integration code is generated based on locations of the label and the digital image in the first user interface and the occurrence of the value in the second user interface. Finally in the example, a client device is caused to display data obtained based on the locations as a result of execution of the integration code by the client device.

To still further illustrate, in a fifth example, a first user interface having a first button object and a second button object is executed, with the first button object being associated with a first value. In the example, human interaction is simulated with the first button object a first time. Also in the example, the human interaction is simulated with the second button object to execute a second user interface in a first state.

Continuing with the fifth example, the human interaction is simulated with the first button object a second time. Further in the example, the second user interface is refreshed to produce the second user interface in a second state. Still in the example, a difference between a second value in the second user interface in the second state and another second value in the second user interface in the first state that has a numeric amount of one is identified.

Continuing further with the fifth example, a third value in the second user interface that is associated with the second value is identified based on the first value. Further in the example, locations of the second value and the third value in the second user interface are obtained. Still in the example, integration code is generated based on metadata that indicates the locations. Finally, in the example, the integration code is provided to a client device to cause, as a result of execution of the integration code by the client device, the client device to obtain the data from the locations in at least one user interface, and display the data in an interface of the client device.

As an illustrative example of one use case of the techniques described in the present disclosure, an above-mentioned service provider may be a library organization. The library organization may be one of many library organizations that utilize one or more interfaces that users may interact with to select and borrow books. A system of the present disclosure may analyze the interfaces of the library organization in order generate integration code capable of, when executed, dynamically interacting with the interfaces for the benefit of the user. In doing so, the system may analyze the interfaces to classify various elements of the interfaces using one or more classification heuristics and/or machine learning algorithms, such as a recurrent neural network (RNN), convolutional neural network (CNN), a random forest classifier, keyword searches, regular expressions, digital image recognition algorithms, and/or variations or combinations thereof, to determine the identity and functionality of the various elements such that the integration code may incorporate and utilize the various elements. The integration code may be code that models or executes various processes using the interfaces of the library organization. In this illustrative example, the integration code may comprise multiple codes for executing various processes through the interfaces of the library organization, such as borrowing a book, returning a book, changing accounts, and the like. For example, if the user desires to select and borrow one or more books from a library organization for which the system of the present disclosure has generated integration code, the user may use the appropriate integration code (e.g., via a mobile device such as a smartphone) to select and borrow a book through the library organization. The integration code may perform one or more processes using the interfaces of the library organization such that the selected book is automatically borrowed for the user.

As an alternative illustrative example, a service provider may be a utility provider. The utility provider may utilize one or more interfaces that users may interact with to perform various processes regarding utilities the users may utilize. A user may desire to change an address registered with the utility provider. The user may cause a system to analyze the interfaces of the utility provider and generate integration code. In some examples, the system may have already analyzed the utility provider and generated integration code. The integration code may be code that models or executes various processes using the interfaces of the utility provider. The integration code may comprise multiple codes for different processes, such as changing an address, updating utility options, activating/de-activating specific services, and the like. The user may use the appropriate integration code to change the address registered with the utility provider. The integration code may perform one or more processes using the interfaces of the utility provider such that the registered address is changed for the user.

The present disclosure provides various examples for use of the techniques described, such as for use by a library organization, for changing an address at a utility provider, for reserving a seat in a movie theater, and so on. These examples are provided for illustrative purposes, and it is contemplated that there are many different types of applications for these techniques. Other example applications of the techniques described in the present disclosure include but are not limited to analyzing interfaces and generating integration code executable to perform automatic form filling (e.g., for a parent teacher association gathering), setting preferences in an account profile, changing cookie preferences for a website, performing web site interaction for a sight-impaired user, and so on.

Note that the illustrative examples above are for illustrative purposes only, and the techniques described in the present disclosure are contemplated to be applicable to a variety of other service providers that have interfaces accessible via a client device. In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

Techniques described and suggested in the present disclosure improve the field of computing, especially the field of computer interface interaction, by creating integration code that, when executed, allows a device to automatically configure elements of a user interface in accordance with a user's preferences without requiring input from the user. Additionally, techniques described and suggested in the present disclosure improve the usability of computer systems by allowing users to share configured interfaces with other users even when the interface itself lacks the ability to do so. Moreover, techniques described and suggested in the present disclosure are necessarily rooted in computer technology in order to overcome problems specifically arising with being able to determine the functionality, values, and attributes of various elements of an interface by dynamically interacting with the elements and observing the results of the interaction.

FIG. 1 illustrates an example 100 of dynamic identification of user interface elements through unsupervised exploration in accordance with an embodiment. As illustrated in FIG. 1, the example 100 may include an integration code generator 102, which may interact via a simulated human interaction 126 with a first interface 104 through a set of first elements 120. In some examples, the integration code generator 102 may utilize the first interface 104 to interact with a set of second interfaces 112, which may comprise a set of second elements 122. In various examples in the present disclosure, an interface element may refer to an individual component of the interface having one or more attributes. Likewise, in the present disclosure, an interface element may alternatively be referred to as an "object" of a document object model (DOM) of the interface.

In an embodiment, the integration code generator 102 may be any entity operable to access various systems and/or services. The integration code generator 102 may be implemented as software, hardware, and/or variations thereof. The integration code generator 102 may interact with various interfaces to identify the various interfaces as well as elements within the various interfaces. In some examples, the integration code generator 102 may be implemented as an application or service executing on a computing device, such as the computing device 1300 of FIG. 13. Examples of such a computing device include one or more instances of a physical computing instance (e.g., a physical server computer, a mobile communication device, a laptop computer, a tablet computer, a personal computer, a mainframe, etc.) or one or more instances of a virtual computing instance, such as a virtual machine hosted on one or more computer servers, or other computing system capable of communicating with various systems and/or services. The integration code generator 102 may interact with various interfaces, such as Internet webpages (e.g., markup language interfaces), computing applications, computing services, mobile devices, and/or variations thereof.

In an embodiment, the simulated human interaction 126 is an element that the integration code generator 102 utilizes to interact with various interfaces. In various embodiments, the simulated human interaction 126 may vary in implementation depending on which interface the integration code generator 102 is interacting with. For example, the integration code generator 102 may be interacting with an Internet website through a user interface typically generated from source code written in Hypertext Markup Language or other comparable markup language (referred to as a "markup language interface"), in which the simulated human interaction 126 may be implemented by simulating (e.g., via execution of event handlers, such as onClick, onMouseOver, onMouseOut, onKeyDown, etc.) a pointer or mouse cursor. As an alternative example, the integration code generator 102 may interact via a command-line interface, in which the simulated human interaction 126 may be implemented according to various text commands. In some examples, the simulated human interaction 126 is any element/entity that enables the integration code generator 102 to interact with a desired interface.

The first interface 104 may be an interface of a computing service provided by a service provider. Examples of services a computing service may provide include data processing, data storage, applications, security, encryption, and/or other such services. The first interface 104 may be an interface of a service accessible through the Internet, such as a library service, utility service, television service, entertainment service, and/or variations thereof. The first interface 104 may comprise the set of first elements 120, through which an entity may interact with the first interface 104.

The integration code generator 102 may analyze the first interface 104 as well as the set of first elements 120 in order to classify and/or identify the set of first elements. For example, the integration code generator 102 may analyze various elements of the first interface 104 (e.g., such as the source/software code of the first interface 104, the DOM of the first interface 104, and/or intercepted communications between a user device and the computing service) to determine information about the first interface 104. The integration code generator 102 may analyze the structure of the first interface 104 (e.g., a DOM of the interface) to identify a set of interface element nodes. The integration code generator 102 may pass the set of interface element nodes as input to one or more machine learning classifiers and/or heuristics in order to classify the set of interface element nodes. The resulting set of classified interface element nodes (also referred to as a set of classified interface objects) may be organized/ranked in accordance with a likelihood of being a certain type of interface object. For example, if an interface object having the object type of "button" is sought, the set of classified interface element nodes may be listed in order of likelihood that they are "button" objects. Likewise, if an interface object having the object type of "radio button" is sought, the set of classified interface element nodes may be listed in order of likelihood that they are "radio button" objects.

Note that, it is contemplated that the various interface control objects referred to in the present disclosure, such as buttons or radio buttons, refer to graphical control elements in a user interface that can be interacted with. Examples of interface control objects include, but are not limited to, buttons, radio buttons, checkboxes, drop-down lists, text/number fields, hidden fields, date/time controls, telephone number fields, Uniform Resource Locator fields, color pickers, email address fields, range controls, file upload controls, search fields, and other such control objects. It is further contemplated that such interface control objects need not be limited to Hypertext Markup Language control objects, but may include option selection controls in other types of interfaces having similar characteristics. For example, a "button" object may refer to any graphical control element that enables an entity to trigger an event by interacting with the graphical control element. Likewise, a "radio button" may refer to any graphical control element that allows an entity to choose only one of a predefined set of mutually exclusive options. Similarly, a "checkbox" may refer to any graphical control element that allows an entity to make a binary choice between two mutually exclusive options. As well, a "drop-down list" may refer to any graphical control element that allows an entity to choose one value from a list of values.

Based on the classifications, the integration code generator 102 may determine a subset of the set of classified interface element nodes to be the set of first elements 120. The integration code generator 102 may further determine which of the set of first elements 120 perform the function(s) sought in a manner as described below.

As an example, the first interface 104 may be a markup language interface of a library organization that enables its patrons to search for and reserve books and/or to take advantage of other services provided by the library, and the integration code generator 102 may analyze the set of first elements 120. In some examples, the analysis may involve the integration code generator 102 selecting various elements of the set of first elements 120 via the simulated human interaction 126, and analyzing the results and/or corresponding interfaces that may open in response to the selections. Continuing with this example, the integration code generator 102 may select each element of the set of first elements 120, analyze the corresponding results (e.g., the effects of selecting one of the first elements in the interface), and determine that the set of first elements 120 are elements that perform the functionality sought (e.g., adding books to be borrowed to a queue, viewing currently borrowed books, selecting chapters of books to be viewed online or copied, etc.).

The set of second interfaces 112 may be a set of interfaces resulting from interaction with the first interface 104. In some examples, the set of second interfaces 112 may be generated in response to the integration code generator 102 interacting with the set of first elements 120 of the first interface 104 via the simulated human interaction 126. For example, the integration code generator 102 may interact with the set of first elements 120 and analyze the corresponding set of second interfaces 112 to determine the identities of the set of second interfaces 112. Continuing with the above example where the first interface 104 is a markup language interface of a library, the integration code generator 102 may select an element of the set of first elements 120. Continuing with this example, an interface of the set of second interfaces 112 may open in response to the element selection and may be an interface that displays currently borrowed books. Continuing with this example, the integration code generator 102 may analyze the opened interface and determine that it is displaying currently borrowed books. Continuing with this example, the integration code generator 102 may continue this process until the set of second interfaces 112 and/or set of second elements 122 within the set of second interfaces is correctly identified.

The set of second interfaces 112 may be interacted with through the set of second elements 122. In some examples, the set of second elements 122 may be interacted with by the integration code generator 102 via the simulated human interaction 126 to form a set of third interfaces in a same or similar manner that the set of second interfaces 112 were formed from interaction with the set of first elements 120 of the first interface 104 by the integration code generator 102 via the simulated human interaction 126. In various embodiments, for a given interface, the integration code generator 102 may continuously select various elements, and analyze corresponding interfaces that open, to identify all elements and resulting interfaces from the given interface. In various embodiments, the integration code generator 102 may utilize various classification heuristics and/or machine learning algorithms.

Figure 2:
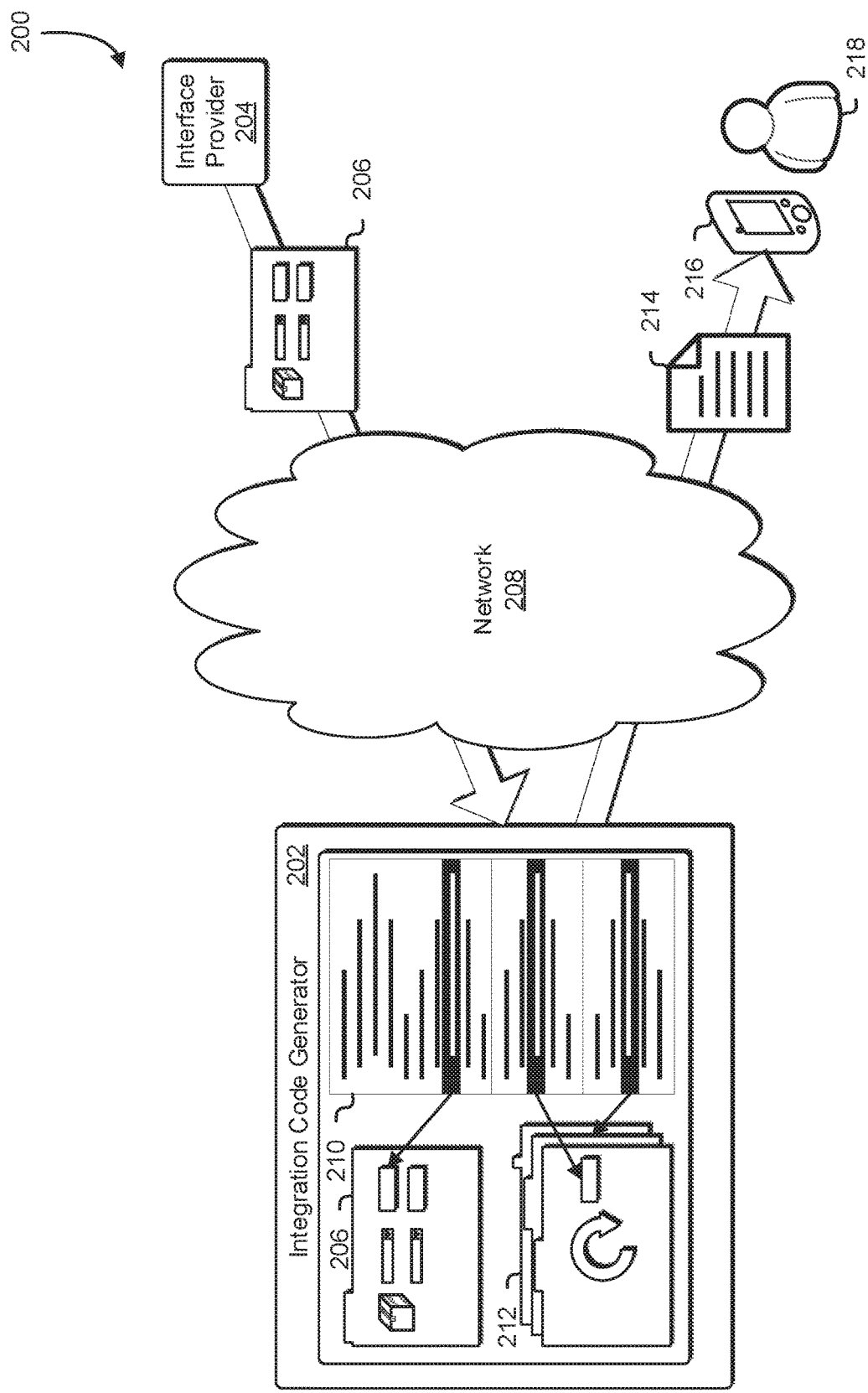
FIG. 2 illustrates an example of identifying user interface elements in a provided interface and generating integration code in accordance with an embodiment.

FIG. 2 illustrates an example 200 of identifying user interface elements in a provided interface and generating integration code in accordance with an embodiment. As illustrated in FIG. 2, the example 200 includes an interface provider 204, which may provide an initial interface 206 via a network 208 to an integration code generator 202, which may determine a DOM 210 corresponding to the initial interface 206 and a set of candidate interfaces 212 that are executed in response to engaging (e.g., simulating human interaction with) interface controls in the initial interface 206. The integration code generator 202 may generate, based on the information gathered from interacting with the initial interface 206 and the set of candidate interfaces 212, integration code 214, which may be provided to a client device 216 operated by a user 218.

The integration code generator 202 may be an entity similar to the integration code generator 102 as described in connection with FIG. 1. The integration code generator 202 may interact with the interface provider 204 through the network 208. In some examples, the network 208 may be any path of communication between the interface provider 204, integration code generator 202, and client device 216. The network 208 may include the Internet, a local area network, a wide area network, Wi-Fi, a cellular network, and/or variations thereof.

The interface provider 204 may be a computing service that may provide interfaces to interact with its various services as described in the present disclosure. In some examples, entities may interact with the interface provider 204 through the initial interface 206. In an illustrative example, the interface provider 204 may be operated by a library organization. Continuing with this example, the initial interface 206 may be a home markup language interface of the library organization, through which entities may interact with to access services of the library organization.

The integration code generator 202 may receive the initial interface 206 through the network 208. The integration code generator 202 may select various user interface elements of the initial interface 206 to produce the set of candidate interfaces 212. The integration code generator 202 may analyze the set of candidate interfaces 212, as well as various elements of the initial interface 206, to determine the DOM 210. In some examples, the DOM 210 is a hierarchical model in a tree structure whereby each node is an object representing part of the interface. Thus, the DOM 210 may comprise a model of the interface objects of the interfaces the interface provider 204 provides, such that the model may be utilized to determine classifications for the objects within the model. The integration code generator 202 may utilize various heuristics, machine learning, keyword searches, regular expressions, digital image recognition, and/or artificial intelligence classification algorithms to classify the objects in the DOM 210. In some examples, the classification method may additionally involve a distance function. For example, a keyword search may find not only exact matches but may find and/or rank inexact matches based on closeness to the keyword; for example a keyword search for the search string "ha" may also return "hat," noting that it has a distance of one because one letter is not an exact match to the search string. After classification of the objects, certain functionalities of the initial interface 206 and/or the set of candidate interfaces 212 objects may be identified.

In an illustrative example, the initial interface 206 may be a home markup language interface of a library organization. Continuing with this example, the integration code generator 202 may receive the initial interface 206, and select (e.g., by simulating human interaction with) various elements of the initial interface 206 to produce the set of candidate interfaces 212. For example, the set of candidate interfaces 212 may themselves be markup language interfaces that are executed as a result of engaging with elements (such as button objects or other interface control objects) of the initial interfaces; the set of candidate interfaces may, for example, be produced by simulating selection of a link to a different markup language interface or may execute in a separate window as a result of simulating a selection of a button element. Continuing with this example, the set of candidate interfaces 212 may be interfaces displaying information such as account information, currently borrowed books, outstanding fines, and various other metrics and services the library organization may utilize and/or provide, and may be accessible through the initial interface 206. Continuing with this example, the integration code generator 202 may analyze the candidate interfaces 212 to determine the identities of the various interfaces; in some examples, the analysis may comprise determining which candidate interfaces 212 correspond to which elements of the initial interface 206. Continuing with this example, the integration code generator 202 may analyze the DOM 210 that models the initial interface 206 and the set of candidate interfaces 212. Continuing with this example, the DOM 210 may include information regarding the functions/identities of each element of the initial interface 206, as well as the identities of the set of candidate interfaces 212 and the functionalities that may be associated with the interfaces.

The effects of interacting with elements within the DOM 210 may be utilized in determining the integration code 214. In some examples, the integration code 214 may be executable code configured to interact with the interface provider 204 through one or more interfaces, such as the initial interface 206 and/or set of candidate interfaces 212. In some examples, the integration code 214 may include code to execute a specific process. For example, the integration code 214 may include code that causes the selection of one or more elements of an interface to accomplish a specified task. In some examples, the integration code 214 may include code that identifies elements and interfaces such that an entity may utilize the elements and interfaces appropriately.

The integration code 214 may be transmitted to the client device 216, whereupon the user 218 may utilize the integration code 214 to interact with the interface provider 204 via the client device 216. In some examples, the user 218 may be any entity operable to access various systems and/or services such as the interface provider 204. The user 218 may interact with various systems and/or services through the client device 216, which may be any operable device, such as a mobile device, computer, and/or variations thereof. As an illustrative example, the user 218 may desire to interact with the interface provider 204, which may be a library organization. Continuing with this example, the user 218 may desire to borrow a book from the library organization through the initial interface 206. Continuing with this example, the user 218 may cause the integration code generator 202 to analyze various elements and interfaces of the library organization, and determine the appropriate integration code 214 to borrow a book utilizing the various elements and interfaces of the library organization. Continuing with this example, the user 218 may receive the integration code 214 via the client device 216, and execute the integration code 214 on the client device 216 such that the desired task for the user 218 is accomplished.

It should be noted that in various embodiments the integration code 214 may be executed by a client device, a remote server, and/or variations thereof, to perform any process in connection with the interface provider 204. In some embodiments, the integration code is in a programming language that can be executed by a device with one or more processors. In alternate embodiments, the integration code 214 may not be strictly executable itself, but may be structured data (e.g., a configuration file, key/value pairs, etc.) that may be processed by a software application running on such a device (e.g., the client device 216) to enable the software application to interact via the device with the interface elements of the interfaces provided by the interface provider 204. In places within the present disclosure referring to execution of integration code, this alternate embodiment is also contemplated.

Additionally, it should be noted that the operations of FIG. 2 may be utilized in any order, including parallel. For example, the integration code 214 may be generated in real-time as the user 218 interacts with the interface provider 204 via the client device 216. Continuing with this example, the integration code 214 may be transmitted to the user 218 as the user 218 is interacting with the interface provider 204; the user 218 may then utilize the integration code 214 to streamline interactions with the interface provider 204. In some alternative examples, the integration code generator 202 may preemptively analyze and determine integration code for a variety of computing services/providers, and provide the integration codes for users desiring certain functionalities from the computing services/providers.

Figure 3:
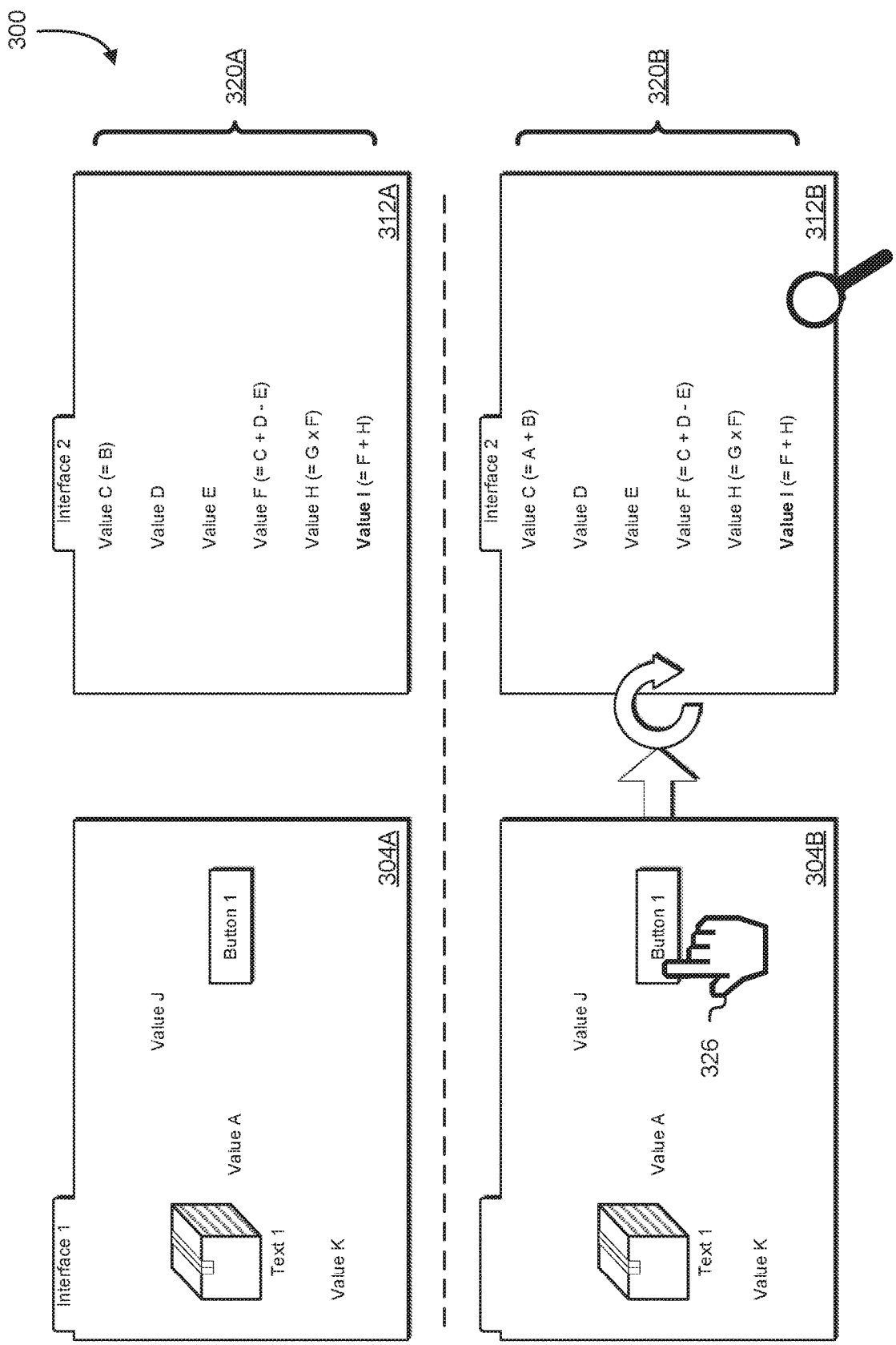
FIG. 3 illustrates an example of identifying an element in one interface that is dependent upon another element in another interface in accordance with an embodiment.

FIG. 3 illustrates an example 300 of identifying an element in one interface that is dependent upon another element in another interface in accordance with an embodiment. As illustrated in FIG. 3, the example 300 includes a first interface at a first time 304A and an initial second interface 312A, which may be associated with each other. The initial second interface 312A may also include interface elements at the first time 320A. Further illustrated in FIG. 3, the example further includes the first interface at a second time 304B and the refreshed second interface 312B, which may be associated with each other. The refreshed second interface 312B may also include interface elements at the second time 320B. In some examples, a simulated human interaction 326 may be utilized to interact with the interfaces.

The first interface at a first time 304A may be an interface of an interface provider, which may provide various services as described in the present disclosure. The first interface at the first time 304A may be similar to the first interface 104 of FIG. 1 or the initial interface 206 of FIG. 2. The initial second interface 312A may be a different interface of the same interface provider that provides the first interface at a first time 304A. The initial second interface 312A may be similar to one of the set of second interfaces 112 of FIG. 1 or one of the set of candidate interfaces 212 of FIG. 2. The second interface may be related to the first interface such that interactions with elements in the first interface may cause changes to the elements in the second interface (upon refresh). As an illustrative example, the interface provider may be a library organization that provides library services. Continuing with this example, the first interface at a first time 304A may be an interface displaying selectable potential books to borrow, and the initial second interface 312A may be an interface displaying a total of selected potential books. The interface elements at the first time 320A may be elements of the initial second interface 312A denoting various actions/values. In some examples, the interface elements at the first time 320A may be associated with various elements of the first interface at a first time 304A.

In some examples, elements of the first interface at a first time 304A may be associated with elements of the initial second interface 312A, and vice versa. As can be seen in the example 300, interface elements at the first time 320A in the initial second interface 312A includes six elements depicting values. The "Value C," as can be seen is equal to some other value, "B." Values "D" and "E" are depicted in the initial second interface 312A, and the "Value F" can be seen to be a summation of "C" plus "D" with a reduction of an amount "E." The "Value H" can be seen to be equal to a value "G" multiplied against "F." Finally, the "Value I" can be seen to be a summation of "F" and "H." The selection of an element on the first interface at a first time 304A may affect a value of the interface elements at the first time 320A, as displayed in the refreshed second interface 312B. As can be seen, the "Value C" is now equal to the previous value "B" plus the amount of "A" from the first interface at the first time 304A.

The values of "F," "H," and "I," being dependent upon the value of "C," may likewise change according to their mathematical correspondence.

In order for an integration code generator, such as the integration code generator 102 as described in connection with FIG. 1, to generate integration code capable of interpreting and engaging with the various interface elements of the first interface and the second interface, the integration code generator 102 or similar entity may attempt to identify an element of the initial second interface 312A that is dependent on an element of the first interface at a first time 304A. The integration code generator may perform one or more processes to identify the element of the initial second interface 312A that is dependent on an element of the first interface at a first time 304A. The integration code generator may perform one or more processes to obtain the first interface at a first time 304A and the initial second interface 312A. In some examples, the integration code generator may be provided with the first interface at a first time 304A and the initial second interface 312A. In some examples, the integration code generator may utilize an input from the entity to obtain the first interface at a first time 304A and the initial second interface 312A. Additionally, in some examples, the integration code generator may be provided with the first interface at a first time 304A, and interact with one or more elements of the first interface at a first time 304A to obtain the initial second interface 312A.

The integration code generator may save a current state (also referred to as a "present state") of the first interface at the first time 304A and, likewise, a current state of the initial second interface 312A. In some examples, the first interface at a first time 304A and the initial second interface 312A may be Internet markup language interfaces, in which a Hypertext Markup Language (HTML) representation of the first interface at a first time 304A and the initial second interface 312A may be stored. In various embodiments, a representation of both the first interface at a first time 304A and the initial second interface 312A may be stored by the integration code generator.

The integration code generator may analyze the elements of the first interface at a first time 304A. The integration code generator may utilize a database comprising various known elements and definitions based upon other conventional interfaces. In some examples, the integration code generator may utilize various keyword searches, regular expressions, digital image recognition algorithms, neural networks, and/or machine learning algorithms to detect and identify elements of the first interface at a first time 304A (e.g., by passing a set of interface element nodes identified as input to one or more machine learning classifiers in order to classify interface element nodes). The integration code generator may determine if any elements of the first interface at a first time 304A match any potentially known elements. In various embodiments, a match does not necessarily require equality. For example, two values may match if they are not equal but are mathematically equivalent. As another example, two values may match if they correspond to a common object (e.g., value) or are in some predetermined way complementary and/or they satisfy one or more matching criteria. Generally, any way of determining whether there is a match may be used. In the case of an element potentially matching a known element, the integration code generator may determine a classification and functionality for the element.

The integration code generator may additionally analyze the interface elements at the first time 320A. The integration code generator may utilize the database as described above, as well as various other algorithms, to attempt to classify the interface elements at the first time 320A. In some examples, the integration code generator may assign a value, or candidate rank, to each interface element of the interface elements at the first time 320A, in which the value may denote a level of confidence that the integration code generator has in determining the identity of a particular element. In some embodiments, the candidate rank value may be assigned by, for each of the interface elements, passing attributes of the interface elements as input to a set of machine learning classifiers that has been trained to classify interface elements in a DOM. For example, if an attribute of an interface element is a digital image, the integration code generator may pass the source path of the digital image to a digital image recognition algorithm to attempt to determine what the digital image depicts; this determination may, in turn, be passed to another machine learning classifier algorithm to determine the classification of an interface element associated with such a digital image. For example, a digital image classification algorithm may return that a digital image associated with an interface element is a symbol for a printer, and a next machine learning classifier algorithm may classify the interface element as a "Send to Printer" type control object. In some examples, the integration code generator may assign all elements a default value and update the value upon further processing/analysis. It is also contemplated that where the present disclosure discusses increasing or decreasing a rank value that, in some embodiments, the rank value may be binary such that the rank value is either true or false.

For example, the integration code generator may determine, as result of passing the attributes of the element "Button 1" through the set of machine learning classifiers, that the element "Button 1" is an element of the first interface at a first time 304A that can be selected/engaged. The element "Button 1" may be a button object or other interface control. The integration code generator may additionally determine, via the set of machine learning classifiers, the functionality of the element "Button 1" based upon historical usages of similar elements. The integration code generator may additionally determine that the element "Button 1" may be associated with the element "Value A." For example, the set of machine learning classifiers may provide a rank value that indicates, based on factors such as proximity to the element "Button 1," that the element depicting "Value A" is associated with the element "Button 1."

The integration code generator may then utilize the simulated human interaction 326, at a second time, to interact with the first interface at a second time 304B. The first interface at the second time 304B may be similar to the first interface 104 of FIG. 1 or the initial interface 206 of FIG. 2. The simulated human interaction 326 may be the result of an entity or execution of a function that enables the integration code generator to interact with a desired interface. In some examples, the simulated human interaction 326 may be implemented as triggering a button or touch event (e.g., onClick, onMouseDown, onMouseUp, etc.). In some embodiments, the integration code generator may simulate human interaction by simulating an input device (e.g., mouse, trackball, keyboard, etc.) to manipulate a pointer object (e.g., mouse cursor) to overlay the interface element and then simulate one or more "clicks" or other event to engage the interface element.

As illustrated in FIG. 3, the integration code generator may utilize the simulated human interaction 326 to select the selectable element "Button 1." The integration code generator may then obtain the refreshed second interface 312B. In some examples, the refreshed second interface 312B may be obtained by refreshing, reloading, or otherwise updating the second interface. For example, the initial second interface 312A may be an Internet markup language interface, in which the refreshed second interface 312B may be obtained by refreshing the markup language interface or retrieving the markup language interface again. The integration code generator may then compare the interface elements at the second time 320B with the interface elements at the first time 320A, which may be stored in various representations by the integration code generator. Note that it is also contemplated that in some cases the refreshed second interface 312B may not be a separate interface from the first interface at the second time 304B, but may instead be a document object model mutation to the first interface at the second time 304B (e.g., an overlay that appears when a set of steps are performed, such as when a cursor hovers over or "clicks" an element in the first interface at the second time 304B).

In the example 300 depicted in FIG. 3, the integration code generator is attempting to determine an element in the second interface that has a value that is related to, but most attenuated from, a value of an element in the first interface by comparing a state of the initial second interface 312A with a state of the refreshed second interface 312B. The integration code generator, upon analyzing the current state of the refreshed second interface 312, may determine that, upon the selection of the "Button 1" element, the value of the element depicting "Value C" is seen to have changed in response. That is, the "Value C," which was equal to "B" in the initial second interface 312A, is now equal to the sum of "B" and "A." Thus, the integration code generator may determine that the element depicting "Value A" from the first interface has a relationship with the element depicting "Value C" in the second interface.

The integration code generator may then update the candidate ranks of the interface elements such that a candidate rank value for the element depicting "Value C" is increased to denote that the integration code generator has increased confidence in its determination of the identity and functionality of the element depicting "Value C." The integration code generator may further determine that because the value of the element depicting "Value C" has increased by the value indicated by the element depicting "Value A," and further increase the candidate rank value for "Value A." The integration code generator may further recognize that "Value F," "Value H," and "Value I" have likewise changed in accordance with a relationship to "Value A." That is, because the element depicting "Value C" has increased by the amount "A" in the refreshed second interface 312B, that the "Value F," which is the sum of "C" plus "D" minus "E," likewise increases by the amount "A." Therefore, the integration code generator may further increase the candidate rank value for the element corresponding to "Value F."

Similarly, the integration code generator may recognize that by comparing the "Value H" in the initial second interface 312A with the "Value H" in the refreshed second interface 312B, the "Value H" is equal to the "Value F" multiplied by a fixed amount "G." In some embodiments, at least one of the interface elements is based on a geographic region or jurisdiction associated with the client device or a user session, the system of the integration code generator, or the location of the interface provider. For example, the fixed amount "G" may be a first percentage value if the client device is associated with or located in a first geographic region but may be a second percentage value if the client device is associated with or located in a second geographic region. Additionally or alternatively, in some embodiments, at least one of the interface elements is based on a value. For example, the value "D" may be a fixed amount that is based on a distance between a first location associated with the entity interacting with the first and second interfaces (e.g., a user, a client device of the user, the integration code generator) and a second location (e.g., a location associated with the interface provider). In an illustrative example, the greater the distance between the first location and the second location, the greater the value "D" may be. In an illustrative example of a library organization, the value "D" may be a number of days a book may be checked out, which may be based on how far from the library the user resides.

Consequently, the integration code generator may determine that the "Value H" has an increased likelihood of having an association with "Value A" from the first interface, and the integration code generator may increase the candidate rank value for the element depicting "Value H" as well. Furthermore, the integration code generator may recognize that "Value I" is equal to the sum of "Value F" and "Value H." Consequently, because "Value H" is mathematically related to "Value F," which, as noted above, is mathematically related to "Value A," the integration code generator may likewise increase a candidate rank value for the element depicting "Value I."

In some embodiments, the integration code generator may correspondingly decrease the candidate ranks of the remaining interface elements, as the integration code generator may determine that the remaining interface elements were unaffected by the selection of the element "Button 1." In alternative embodiments, the integration code generator may leave the candidate ranks of the remaining interface elements unchanged. The integration code generator may further determine, after analyzing the first and second interfaces at the first and second times, that the values "J" and "K," depicted in the first interface, have no correlation to any of the values in the second interface. Consequently, the elements depicting the values "J" and "K" may be determined not to be elements related to a value of an element in the second interface, and may be omitted from further analysis.

In this manner, the integration code generator may, based on the ranking and mathematical relationships, determine that the element depicting the "Value I" is the element related to, but most attenuated from, a value of the element depicting "Value A" in the first interface. Note that the integration code generator may further affect the ranking based on other criteria, such as by increasing the candidate rank value or weighting the candidate rank value of an element based on other attributes of the element, such as bold text, a higher or lower value (from other candidate elements), a symbol or keyword (e.g., "Total," "Subtotal," "#," etc.) found in another element proximate to the element in question. For example, as seen in the example 300, "Value I" is in bold text, which may cause its ranking by the integration code generator to be increased by a predetermined weight value. As another example, "Value F" may be higher than "Value C," which may result in the candidate ranks for the element depicting "Value F" to be more heavily weighted in favor of being the particular element sought. Similarly, "Value I" may be still higher from "Value F," which may result in the candidate ranks for the element depicting "Value I" to be even more heavily weighted in favor of being the particular element sought.

Note that it is contemplated that various methods of ranking may be used in implementing the techniques described in the present disclosure. For example, determining a correlation between the "Value A" and a value, such as "Value I," need not be so complex as in the illustrated example, but may be that "Value I" is an amount that is within a tolerance threshold of "Value A." As another example, while in some schemes a higher candidate rank value indicates a better match to a sought element, in some schemes a lower candidate rank value may indicate a better match. As noted above, in some embodiments the candidate rank value may be binary such that the candidate element may be determined to either be the sought element or not.

In the example 300 depicted, the element depicting "Value I" may result in the highest candidate rank value and be determined to be the sought value. Based on this determination and metadata about the element depicting "Value I" (e.g., element identifier, location within the HTML source code, etc.), the integration code generator may generate integration code that, upon execution by a client device, causes the client device to locate the corresponding element in another version of the second interface provided by the interface provider, extract the target value of the element. Once extracted, the client device may, via an application running on the client device, may perform one or more operations utilizing the target value; for example, the client device may display the target value, may compare the target value against some other value (e.g., a threshold, a value associated with the individual associated with the client device, another value extracted from another interface, etc.), may store the target value (e.g., in a browser cookie, in a local or remote data store, in a user session, etc.), transmitting the target value to a third party entity, or perform some other operation.

The example 300 depicted in FIG. 3 has been simplified to a single first interface and single second interface for ease of explanation. It is contemplated, however, that in embodiments the integration code generator may perform the analysis described above for multiple first and second interfaces of the same interface provider in order to arrive at a final determination of the relationships between elements in the first interface and elements in the second interface. In various embodiments, this process may be repeated to identify all elements of the first and second interfaces. In some examples, the integration code generator may repeatedly simulate human interaction with various elements of the first interface, detect changes in the second interface in response to the simulated human interactions, and determine the relationships, dependencies, functionalities, and/or identities of elements of the first and second interfaces.

---

Algorithm I: Location and Extraction of a User Interface Element State in a User Interface that is Dependent on an Event Occurrence in a Different User Interface

---

Algorithm takes as input several first interfaces (at least 3). Start from one of these interfaces.

Fix a "tolerance threshold" that is given as parameter to the algorithm—usually. In embodiments, this is the number of first interfaces minus 2.

Extract a candidate for what could be a pair of first and second buttons.
 1) Save a "snapshot" of the second interface (a representation of the interface at this time, containing its rendered Hypertext Markup Language (HTML), metadata, etc.). Extract all interface elements that seem to be particular element types (e.g., determined by heuristics). All new elements found receive a rank value of 1—if this is the first iteration of the algorithm, every element's rank value is set to 1. All new elements found are marked as "alive."
   a. If there are no first interfaces left, continue to step 6.
2) On the first interface, identify all elements that approximately match the particular element type (this collection is referred to as the "particular element candidates").
3) Engage the first button.
4) Refresh second interface. Extract all interface elements that approximately match the particular element types again. Match these particular element values to the particular values on the snapshot of the interface at step 2). (In embodiments, this is done using XML Path Language (XPath) and Cascading Style Sheets (CSS) selectors of the elements). In embodiments, at this step, identify which elements were present on the second interface before engaging the first button, and which elements appeared afterwards.
5) For the elements that are "alive" and existed previously, mark the ones whose value changed. If the value of such an element changed by a number that is not in the set of "particular element candidates," this element is given a "flag." If the number of flags is greater than the "tolerance threshold" defined in the initialization step, this element is discarded from further consideration—(e.g., marked as "dead"). The rank value of all elements remaining "alive" is now increased by 1.
   a. Repeat from step 2.
6) Infer that the particular element of the second interface corresponds to the particular element candidate with the highest rank. Break ties according to a predetermined method (e.g., pseudorandomly, according to which element has the highest amount and/or largest text, etc.).

Figure 4:
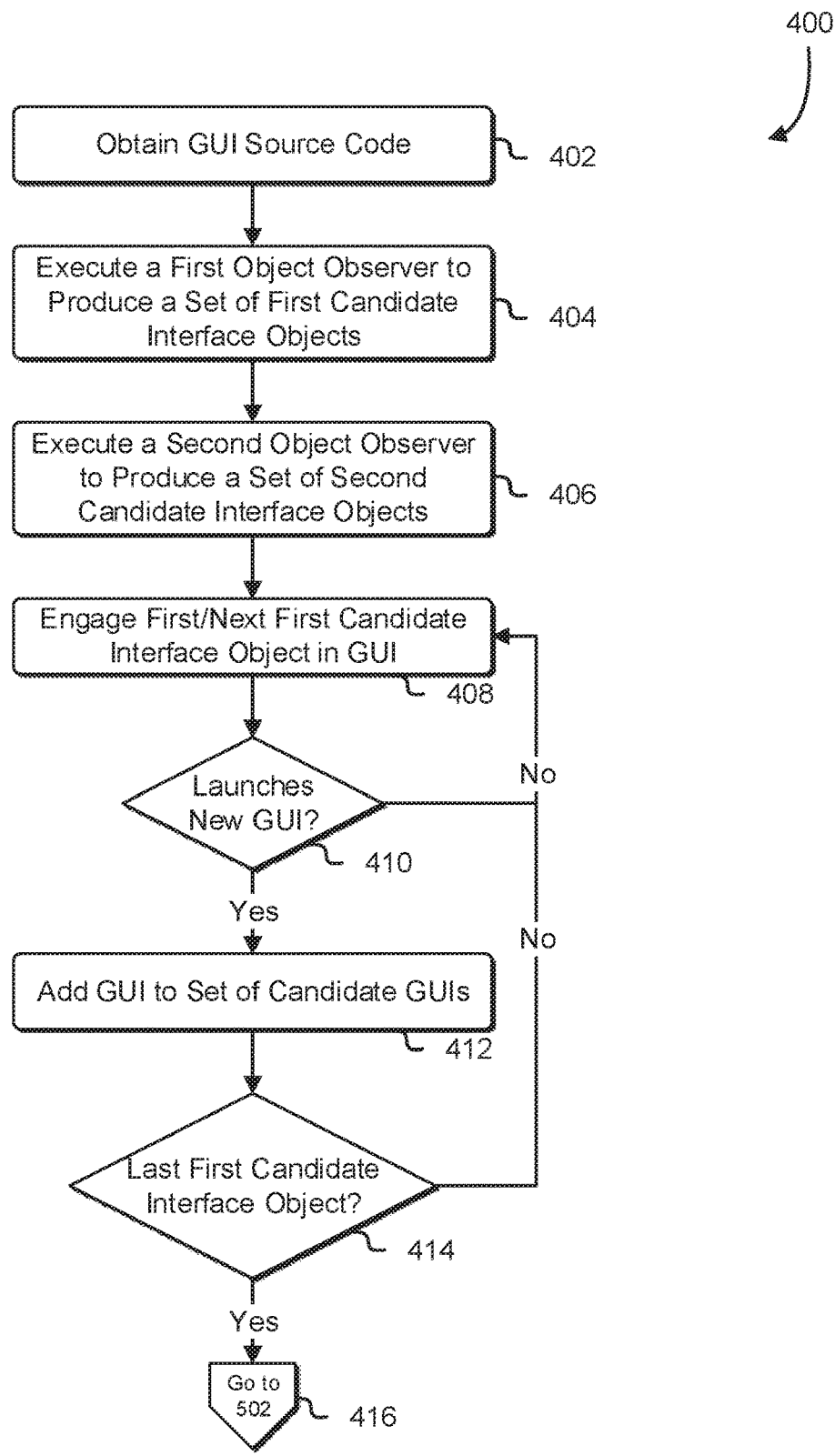
FIG. 4 is a flowchart that illustrates an example of identifying an element in one interface that is dependent upon another element in another interface in accordance with an embodiment.

FIG. 4 is a flowchart illustrating an example of a process 400 for identifying an element in one interface that is dependent upon another element in another interface in accordance with various embodiments. Some or all of the process 400 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash media). For example, some or all of process 400 may be performed by any suitable system, such as the computing device 1300 of FIG. 13. The process 400 includes a series of operations wherein user interface source code of an initial interface is obtained, a pair of object observers are executed to produce a set of first candidate interface objects and a set of second candidate interface objects, and then, engaging with each of the first candidate interface objects to determine if a new user interface is executed as a result, and adding the user interfaces that are executed to a set of candidate user interfaces. The candidate interface objects may be button objects (such as "submit" buttons) or other interface controls. Once the candidate user interfaces are determined, the system proceeds to perform the process 400 of FIG. 5. The system performing the process 400 may desire to identify elements of various interfaces, which may be provided by an interface provider. In some examples, the system may be a system such as the integration code generator 102 as described in connection with FIG. 1.

In 402, the system may obtain user interface source code of an initial interface. In some examples, the system may obtain the source code by interfacing with the interface provider (e.g., establishing a network connection and receiving the source code from the interface provider via the network connection). In some examples, the system may be provided with (e.g., pushed) the user interface source code.

In 404, the system may execute a first object observer to produce a set of first candidate interface objects. The first object observer may be an application, computer software program, or otherwise any entity that may analyze an interface on behalf of the system. The first object observer may utilize various heuristics, algorithms, processes, and/or variations thereof, to detect and analyze various interface objects. The first object observer may analyze the user interface/initial interface to determine the set of first candidate interface objects. In some examples, the set of first candidate interface objects may be elements of the user interface/initial interface that may be interactive. In various embodiments, the first object observer may be configured to detect candidate interface objects that may potentially cause the execution of a new user interface from the initial interface. The first object observer may additionally predict various characteristics of the candidate interface objects of the set of first candidate interface objects, such as functionality, dependencies, and/or variations thereof.

In 406, the system may execute a second object observer to produce a set of second candidate interface objects. The second object observer may be an entity similar to the first object observer. In various embodiments, the second object observer may be configured to detect candidate interface objects that may affect elements in other interfaces. The second object observer may also predict which specific elements are affected by which candidate interface objects of the set of second candidate interface objects. The system may assign candidate ranks to the objects of the set of second candidate interface objects. In some examples, each object may be assigned a default candidate rank. The candidate rank value may represent a degree of confidence that the system has in determining the identity and functionality of a given object.

In 408, the system may engage a first/next object of the set of first candidate interface objects. In some examples, the system may engage the first/next object through the usage of simulated human interaction and/or variations thereof. The system, in 410, may determine if engaging the object executes a new user interface. If engaging the object does not execute a user interface, the system performing the process 400 may return to 408 to engage with the next first candidate interface object until engaging a candidate interface object of the set of first candidate interface objects results in the execution of a new user interface. If engaging the object executes a new user interface, the system may proceed to 412.

In 412, the system, upon determining that engaging the object results in a new user interface, may add the new user interface to a set of candidate user interfaces. In 414, the system may determine if the object engaged with is the last first candidate interface object. If the object engaged with is the last first candidate interface object, the system performing the process 400 may proceed to 416, whereupon the system may perform process 500 illustrated in FIG. 5.

If not, the system may repeat the operations of 408-14 for all of the objects of the set of first candidate interface objects. After engaging with each object of the set of first candidate interface objects, the system, in 416, may proceed to 502. The system may assign candidate ranks to the user interfaces of the set of candidate user interfaces. In some examples, each user interface may be assigned a default candidate rank. The candidate rank value may represent a degree of confidence that the system has in determining the identity and functionality of a given user interface. Note that one or more of the operations performed in 402-16 may be performed in various orders and combinations, including in parallel.

Figure 5:
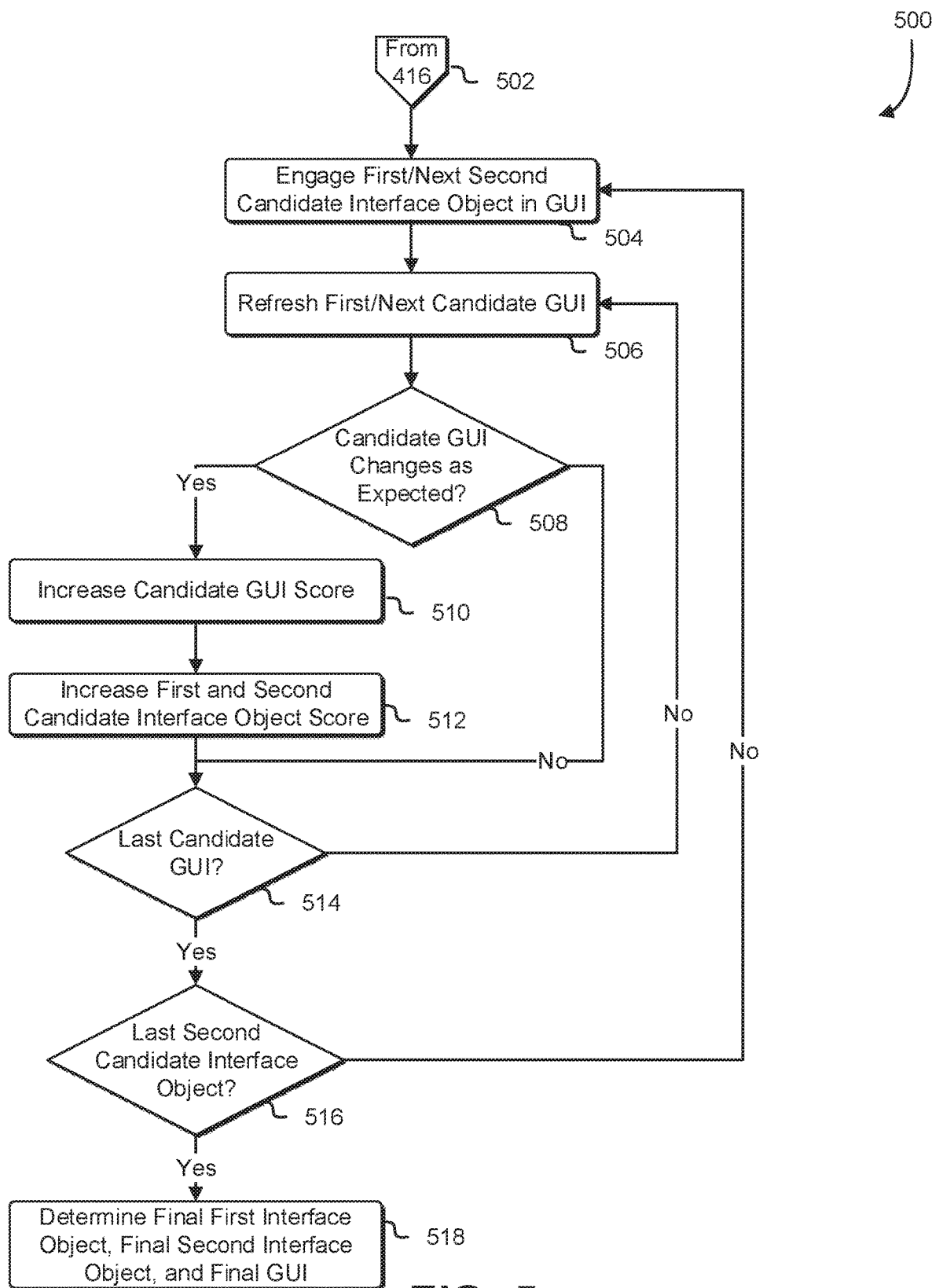
FIG. 5 is a flowchart that illustrates an example of identifying an element in one interface that is dependent upon another element in another interface in accordance with an embodiment.

FIG. 5 is a flowchart illustrating an example of a process 500 for identifying an element in one interface that is dependent upon another element in another interface in accordance with various embodiments. Some or all of the process 500 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash media). For example, some or all of process 500 may be performed by any suitable system, such as the computing device 1300 of FIG. 13. The process 500 includes a series of operations wherein each of the second candidate interface objects from the process 400 of FIG. 4 are engaged, each of the candidate user interfaces is refreshed, and if the candidate user interface changes as expected, and candidate ranks are increased for the candidate user interface, for the first candidate interface object that caused the candidate user interface to execute, and for the second candidate interface object that was engaged prior to the candidate user interface being refreshed. After all of the candidate user interfaces and second candidate interface objects are processed, the final (target) first interface object, the final (target) second interface object, and the final (target) user interface may be determined based on the aforementioned candidate ranks. The candidate interface objects may be button objects (such as "submit" buttons) or other interface controls. The system performing the process 500 may desire to identify elements of various interfaces, which may be provided by an interface provider. In some examples, the system may be a system such as the integration code generator 102 as described in connection with FIG. 1. In an embodiment, the process 500 is a continuation of the process 400.

In 504, the system may engage the first/next second candidate interface object of the set of second candidate interface objects. In some examples, the system may engage the first/next object through the usage of simulated human interaction and/or variations thereof. In 506, the system may refresh first/next user interface of the set of candidate user interfaces. In some examples, the system may refresh a user interface by updating the user interface, which may be done by requesting a current version of the interface from the interface provider or through one or more processes from the system. For example, a user interface may be a markup language interface, which the system may refresh by reloading the markup language interface.

In 508, the system may determine if the candidate user interface changes as expected. The system may expect various user interface changes based on predictions made from the determination and/or analysis of the set of second candidate interface objects. For example, the system may predict that a value depicted by an element in the candidate user interface will increase by an amount that exactly or approximately corresponds to a value depicted by an element in the initial interface. If the candidate user interface changes as expected, the system performing the process 500 may proceed to 510, whereupon the system may increase the candidate rank value of the candidate user interface. Then, in 512, the system may increase the candidate rank value of the first candidate interface object (that caused the candidate user interface to be executed) and/or second candidate interface object. Otherwise, if the candidate user interface does not change as expected, the system may omit increasing the candidate ranks of the candidate user interface and second interface object that was engaged with, and proceed to 514, whereupon the system may determine if the candidate user interface is the last user interface of the set of candidate user interfaces. If the candidate user interface is not the last user interface of the set of candidate user interfaces, the system may repeat the operations of 506-14 for all of the candidate user interfaces of the set of candidate user interfaces.

However, if the candidate user interface is the last user interface of the set of candidate user interfaces, the system performing the process 500 may proceed to 516 to determine if the second candidate interface object that was engaged with is the last candidate interface object of the set of second candidate interface objects. If the second candidate interface object is not the last candidate interface object of the set of second candidate interface objects, the system may repeat the operations of 504-16 for each second candidate interface object of the set of second candidate interface objects. On the other hand, if the second candidate interface object is the last candidate interface object of the set of second candidate interface objects, the system may proceed to 518, whereupon the system may determine, based on the ranking of each, the final first interface object, the final second interface object, and the final user interface. In an embodiment, the final user interface is the candidate user interface of the set of candidate user interfaces with the highest candidate rank, the final second interface object is the second candidate interface object of the set of second candidate interface objects with the highest candidate rank, and the final first interface object is a candidate interface object of the set of candidate interface objects, that, as a result of engaging the first interface object, results in the execution of the first user interface.

In some examples, the system may determine that upon engaging the first interface object, the first user interface is executed in response, and, upon engaging the second interface object, one or more elements of the first user interface change in response to the engaging. The system may further determine various characteristics of the dependency between the first user interface, the first interface object, and the second interface object. As an illustrative example, an initial interface comprising the first interface object may be an interface of a library organization. Continuing with this example, the first interface object may be a selectable element that allows an entity to view which books are currently borrowed, and may open the first user interface when selected, which may be an interface comprising the currently borrowed books. Further continuing with this example, the second interface object may be a selectable element denoting an action to borrow a specific book, in which, upon selection of the second interface object, the first user interface is updated to reflect the addition of the specific book as part of the currently borrowed books. Note that one or more of the operations performed in 502-18 may be performed in various orders and combinations, including in parallel.

The metadata (e.g., object types, identifiers, attributes, locations in the interface source code, proximity to other elements, etc.) about the final first interface object, the final second interface object, and the final user interface may be used by the integration code generator to generate integration code that, upon execution, causes a device to engage with corresponding interface objects and user interfaces of different first interfaces by the same interface provider. Such as, in the illustrative example where the interface provider is a library organization, the integration code generator may generate integration code that, if executed, allows a library book to be automatically added to a queue of a user regardless of the particular book or user. Note, however, that the processes 400 and 500 of FIGS. 4 and 5 may need to be performed for multiple first interfaces of the interface provider to obtain additional correlation that the final first interface object, the final second interface object, and the final user interface are the correct interface objects and correct user interface. That is, if the final interface objects in a different (e.g., second) first user interface correspond to the final interface objects from the first user interface, the integration code generator has increased certainty that the identified interface objects and user interface are correct.

Figure 6:
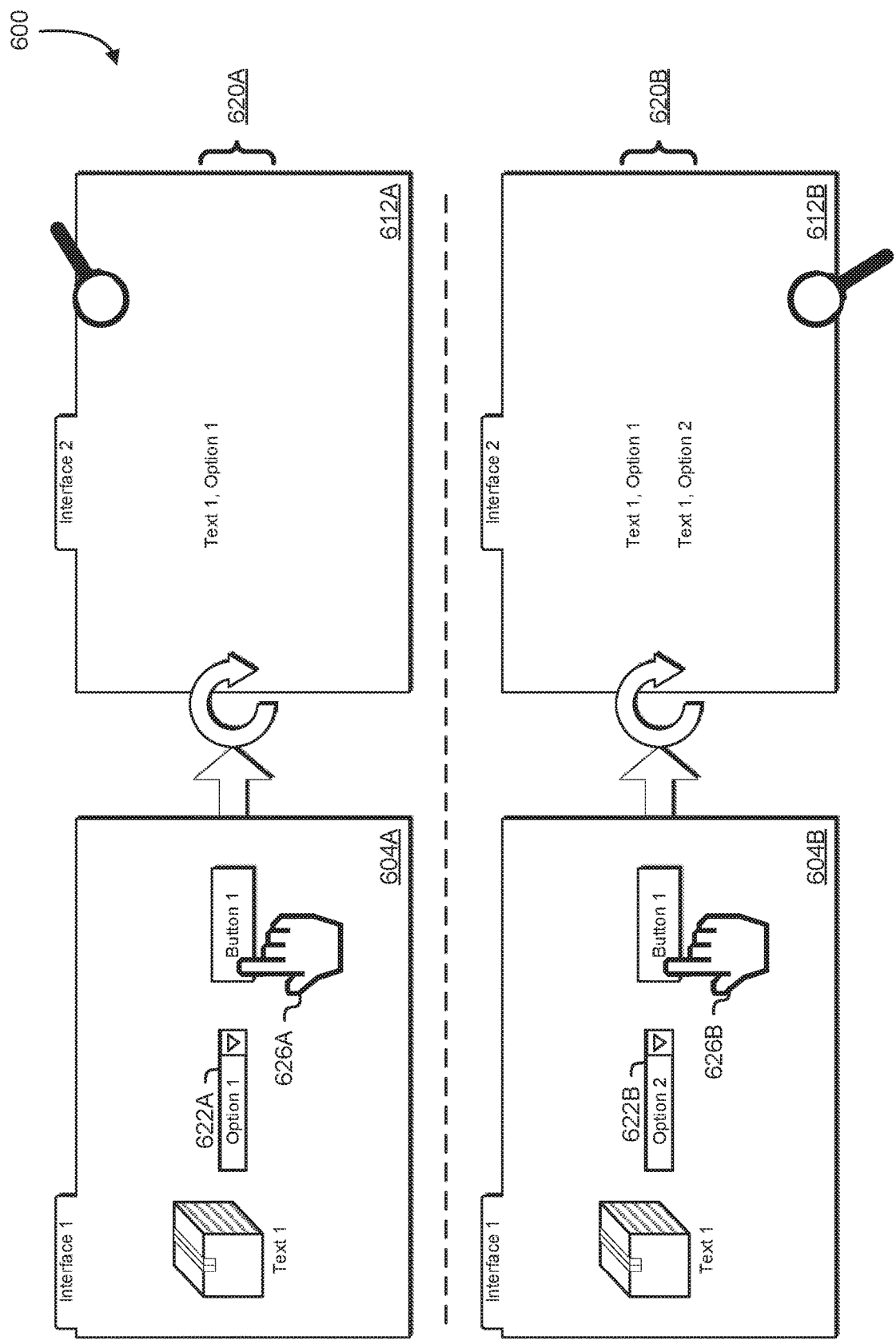
FIG. 6 illustrates an example of identifying an element in one interface that is dependent upon a configuration of another element in another interface in accordance with an embodiment.

Many interfaces may require a user to select one or more options from an option selection element before a form can be submitted. FIG. 6 illustrates such an interface where an option is selected prior to engaging a button object. FIG. 6 illustrates an example 600 of identifying an element in one interface that is dependent upon a configuration of another element in another interface, in accordance with an embodiment. As illustrated in FIG. 6, the example 600 includes a first interface at a first time 604A comprising an option selection element at the first time 622A operable by a first simulated human interaction 626A, which may be associated with an initial second interface 612A comprising interface elements at the first time 620A (an initial time). Note that the option selection element may be any interface element from which one or more options may be selected. Example option selection elements include but are not limited to drop-down list element objects, radio button element objects, and checkbox element objects. The example 600 also includes a first interface at a second time 604B comprising an option selection element at the second time 622B operable by a second simulated human interaction 626B, which may be associated with a refreshed second interface 612B comprising interface elements at a second time 620B (subsequent to the initial time).

The first interface at a first time 604A may be an interface of an interface provider, which may provide various customizable services. The first interface at the first time 604A and the first interface at the second time 604B may be similar to the first interface 104 of FIG. 1 or the initial interface 206 of FIG. 2. The initial second interface 612A may be a different interface of the interface provider, and may denote various information originating from the first interface at a first time 604A. The initial second interface 612A may be similar to one of the set of second interfaces 112 of FIG. 1 or one of the set of candidate interfaces 212 of FIG. 2. The second interface may be related to the first interface such that interactions with elements in the first interface may cause changes to the elements in the second interface (upon refresh). As an illustrative example, the interface provider may be a cinema reservation service, in which the first interface at a first time 604A may be a seat customization interface, comprising options customizable through the option selection element at the first time 622A such as seat preference, heat preference, food preference, and/or variations thereof. Continuing with this example, the initial second interface 612A may be an interface that, through the interface elements at the first time 620A, displays chosen options as an initial listed selection.

In some examples, elements of the first interface may be associated with elements of the initial second interface 612A, and vice versa. For example, the selection of an option on the first interface may affect a value displayed on the initial second interface 612A and/or the initial second interface 612A. In order for an integration code generator, such as the integration code generator 102 as described in connection with FIG. 1, to generate integration code capable of interpreting and engaging with the various interface elements of the first interface and the second interface, the integration code generator 102 or similar entity may attempt to identify an element of the second interface that is dependent on an element of the first interface.

The integration code generator may perform one or more processes to obtain the first interface at a first time 604A. In some examples, the integration code generator may be provided with the first interface at a first time 604A and/or the initial second interface 612A. In some examples, the integration code generator may utilize an input from the entity to obtain the first interface at a first time 604A. The integration code generator may analyze the first interface at a first time 604A. In some examples, the integration code generator may utilize various keyword searches, regular expressions, digital image recognition algorithms, neural networks, and/or machine learning algorithms to detect and identify elements of the first interface at a first time 604A (e.g., by passing a set of interface element nodes identified as input to one or more machine learning classifiers in order to classify interface element nodes). The integration code generator may determine if any elements of the first interface at a first time 604A match any potentially known elements. The integration code generator may determine that the selection of one or more elements of the first interface at a first time 604A results in the initial second interface 612A. The integration code generator may additionally determine that the selectable element "Button 1" may affect the initial second interface 612A. The element "Button 1" may be a button object (such as a "submit" button) or other interface control. The integration code generator may select the element "Button 1" utilizing the first simulated human interaction 626A. The integration code generator may also utilize the first simulated human interaction 626A to obtain the initial second interface 612A. The first simulated human interaction 626A may be hardware or software that enables the integration code generator to simulate human interaction to interact with a desired interface. In some examples, the first simulated human interaction 626A may be implemented by simulating (e.g., via execution of event handlers, such as onClick, onMouseOver, onMouseOut, onKeyDown, etc.) a pointer or mouse cursor.

The integration code generator may save the current state (or initial state) of the first interface at a first time 604A and the initial second interface 612A. In some examples, the first interface at a first time 604A and the initial second interface 612A may be Internet markup language interfaces, in which an HTML representation of the first interface at a first time 604A and the initial second interface 612A may be stored. In various embodiments, a representation of both the first interface at a first time 604A and the initial second interface 612A may be stored by the integration code generator. The integration code generator may analyze the initial second interface 612A and determine that the element reading "Text 1, Option 1" corresponds to the element reading "Text 1,"

the option selection element at the first time 622A reading "Option 1," and the selectable element reading "Button 1" of the first interface at a first time 604A. The integration code generator may predict, as a result, that the option selection element at the first time 622A is a configuration option that, upon selection of the element "Button 1," affects elements of the initial second interface 612A.

The integration code generator may utilize the second simulated human interaction 626B to select a different option from the option selection element, which may be denoted as "Option 2," from the option selection element at the second time 622B. The integration code generator may then utilize the second simulated human interaction 626B to select the element "Button 1." The integration code generator may refresh the initial second interface 612A to obtain the refreshed second interface 612B. The refreshed second interface 312B may be similar to one of the set of second interfaces 112 of FIG. 1 or one of the set of candidate interfaces 212 of FIG. 2. In some examples, the refreshed second interface 612B may be obtained by refreshing or otherwise updating the initial second interface 612A.

The integration code generator may compare the subsequent state of the refreshed second interface 612B with the stored representation (initial state) of the initial second interface 612A. The integration code generator may determine that the interface elements at the second time 620B comprise an additional element reading "Text 1, Option 2" not present in the interface elements at the first time 620A, and further determine that the addition of the element "Text 1, Option 2" is a result of a configuration of the option selection element at the second time 622B selecting the element "Option 2" and the selection of the element reading "Button 1." The integration code generator may determine that the option selection element is a configuration element where, upon selection of a specific configuration and selection of the element reading "Button 1," the specific configuration is displayed in the second interface.

Note, although the first interfaces 604A-04B are shown for ease of explanation to only include a single option selection element, it is contemplated that a first interface may have multiple option selection elements of one or more types (e.g., drop-down lists, radio buttons, checkboxes, etc.). The additional option selection elements may be identified, as with the first option selection element, based on classification data obtained by providing information about the first interface (e.g., source code of the first interface) as input to a set of machine learning classifiers. Each of the additional option selection elements may be associated with their own set of additional options. In some cases, options for all of the option selection elements must be selected for the new listed selection to appear in the corresponding second interface, whereas in other cases only a subset of the option selection elements must have an option selected for the new listed selection to appear in the corresponding second interface. As with the single option, the simulated human interaction may be performed to select an option of the additional option selection elements, and, further, the new listed selection element may include an indication that the options corresponding to the additional option selection elements were selected. In embodiments, each different combination of options of the option selection elements may result in a new listed selection element upon engaging the button object and refresh of the second interface.

Based upon the determination, the integration code generator may generate integration code that models the elements of the various interfaces. In some examples, the integration code may be executable code that performs a customization process. In some examples, the integration code may comprise functions that allow an entity to streamline customization processes within one or more interface providers. As an illustrative example, the interface provider may be a cinema reservation service. Continuing with this example, the first interface may be a seat customization interface, comprising options selectable through the option selection element such as seat preference, heat preference, food preference, and/or variations thereof, which may be added with the element reading "Button 1." Continuing with this example, the second interface may be an interface that, through the interface elements, displays chosen options. Continuing with this example, the integration code generator may analyze and perform various processes with the interfaces of the cinema reservation service to determine integration code to reserve a movie with food and drink. Continuing with this example, the integration code may cause an entity to select desired options through the option selection element, add the desired options through the "Button 1" element, and view the resulting interface elements of the second interface displaying the selected and added options.

---

Algorithm II: Unsupervised Location and Extraction of Option Elements in a User Interface

---

Algorithm takes as input a first interface, a first button, and a second button, and identifiers for a particular element value, label, and digital image on the first interface, and a method for detecting the item elements on the second interface (as described in the present disclosure).
1) On the first interface, engage the first button and inspect the second interface. Define the "subject node" of the first interface as the lowest common ancestor of the particular element value, digital image, label and first button elements on the first interface.
2) Interact with an "interactable" element in the first interface (as determined by a classifier (e.g., a heuristic)) and engage the first button again.
   a. If no more interactable elements remain, move to step 5.
3) If a new item element appears and its characteristics (e.g., label, digital image, value) are different than all item elements seen so far, mark the interactable element as an option element.
4) Go back to step 2).
5) Cluster the option elements by grouping them according to their lowest common ancestor. A configuration field for any configuration option X is then the lowest node in the DOM tree, which makes this node a common ancestor between option X and any other option detected. This ancestor is then the configuration field, containing all options possible for that field. Return the configuration structured in fields with the detected possible options for each field.

Figure 7:
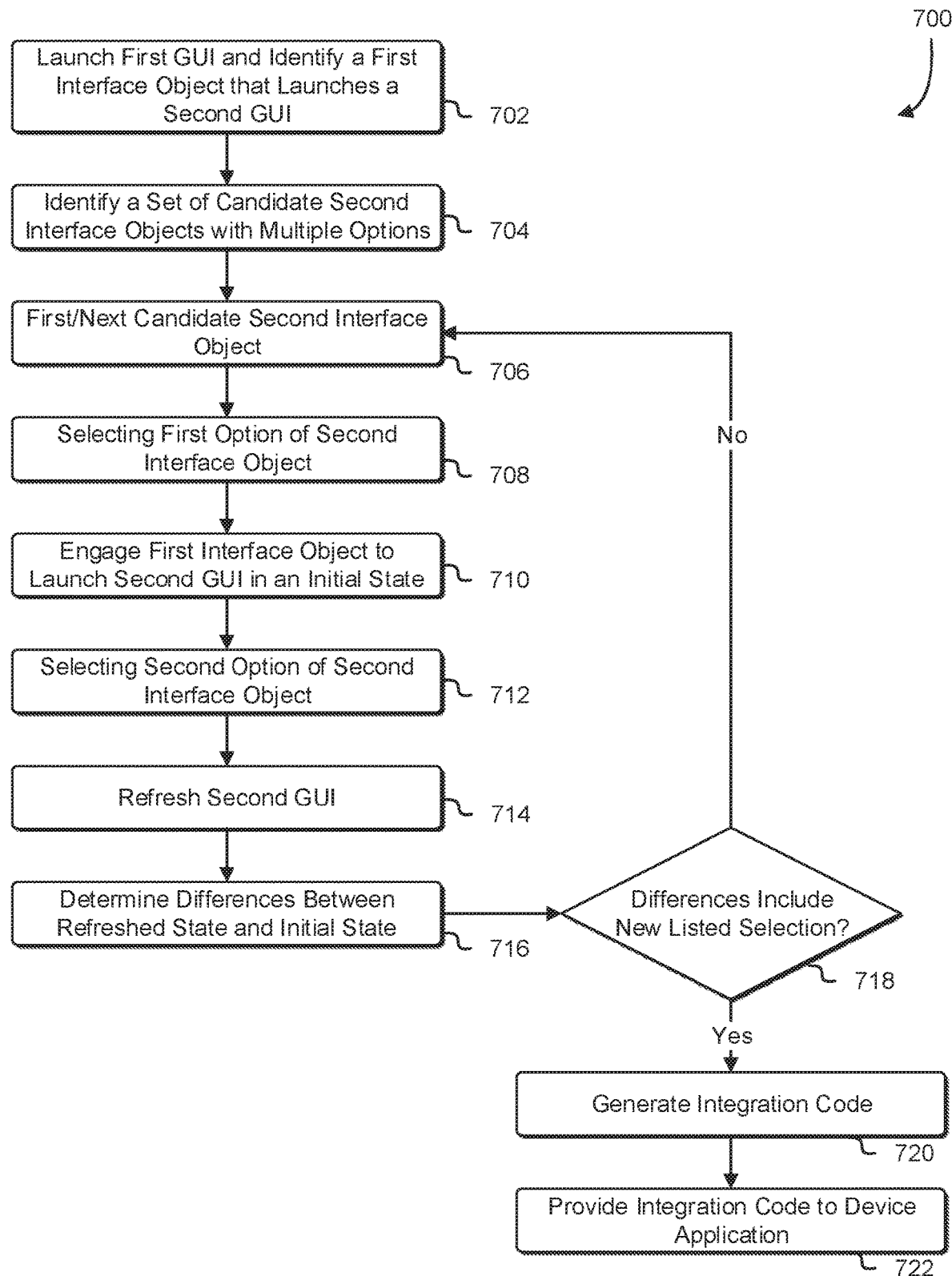
FIG. 7 is a flowchart that illustrates an example of identifying an element in one interface that is dependent upon a configuration of another element in another interface in accordance with an embodiment.

FIG. 7 is a flowchart illustrating an example of a process 700 for identifying an element in one interface that is dependent upon a configuration of another element in another interface, in accordance with various embodiments. Some or all of the process 700 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash media). For example, some or all of process 700 may be performed by any suitable system, such as the computing device 1300 of FIG. 13. The process 700 includes a series of operations wherein a first user interface is executed and a first interface object that executes a second user interface is identified, a set of candidate second interface objects having multiple options are identified, and, for each of the second candidate interface objects, various options are selected, and a determination is made whether a new listed selection appears in a refreshed second user interface. The candidate interface objects may be button objects (such as "submit" buttons) or other interface controls. The system performing the process 700 may be a system such as the integration code generator 102 as described in connection with FIG. 1.

In 702, the system may execute a first user interface and identify a first interface object that executes a second user interface. The first user interface may be an interface of an interface provider, such as the first interface 104 of FIG. 1 or the initial interface 206 of FIG. 2, which may provide various customizable services. The system may identify the first interface object. The system may analyze the first user interface to determine the first interface object. In some examples, the first interface object may cause the execution of a second user interface. The process for identifying the first interface object may be similar to the processes 400 and 500 described in conjunction with FIGS. 4 and 5. In some examples, the first interface object may be identified through the usage of various classification algorithms/process to determine if the first interface object matches any known elements capable of executing the second user interface.

In 704, the system identifies a set of candidate second interface objects with multiple options. In some examples, the set of candidate second interface objects may be objects that allow selection of various options. In various embodiments, objects of the set of candidate second interface objects may be elements similar to the option selection element 622 as described in connection with FIG. 6. The system may, in 706, iterate through the candidate second interface objects of the set of candidate second interface objects with multiple options.

In 708, the system may select a first option of a candidate second interface object. In some examples, the first option may be part of a set of options of the candidate second interface object. As an illustrative example, the candidate second interface object may be an element denoting seat preferences for a cinema reservation, in which the set of options may be different seat locations. The system may then, in 710, engage the first interface object to execute a second user interface in an initial state. The system may save a representation of the initial state. In 712, the system may select a second option of the candidate second interface object. In 714, the system may refresh the second user interface. In some examples, the system may refresh the second user interface by engaging with the first interface object. In some examples, the system may refresh the second user interface by causing the second user interface to update through one or more processes, such as interacting with one or more interface providers. The system may additionally save a representation of the updated, refreshed (or subsequent) state of the second user interface.

In 716, the system may determine differences between the refreshed state and the initial state of the second user interface. The system may compare the refreshed state with the initial state. In some examples, the system may compare similar elements of the refreshed state with similar elements of the initial state, and analyze any potential differences. In 718, If the differences do not include the new listed selection, or the differences include the new listed selection as well as other unexpected differences, the system performing the process 700 may return to 706 to process the next candidate second interface object of the set of candidate second interface objects with multiple options, and repeat the operations of 706-18 until the differences include the new listed selection and the appropriate candidate second interface object with multiple options is determined. On the other hand, if the differences include the new listed selection (e.g., the "Text 1, Option 2" of FIG. 6), the system may proceed to 720 to generate the integration code. In various embodiments, the new listed selection may include the selected second option. In some examples, if the differences include the selected second option, the system may determine that the candidate second interface object with multiple options corresponds to a configuration of an element of the second user interface.

In 720, the system may generate integration code based on metadata about the new listed selection (e.g., object type, identifier, attributes, location in the second user interface source code, proximity to other elements, etc.) and the corresponding interface object that caused the new listed selection to appear in the second user interface. In some examples, the integration code may be executable code that performs a customization process (e.g., a process to automatically select options from option elements in accordance with a specified configuration). In some examples, the integration code may comprise functions that allow an entity to streamline customization processes within one or more interface providers. As an illustrative example, the interface provider may be a cinema reservation service. Continuing with this example, the first user interface may be a seat customization interface, comprising options selectable through the appropriate candidate second interface object such as seat preference, heat preference, food preference, and/or variations thereof, which may be confirmed with the first interface object. Continuing with this example, the second user interface may be an interface that displays a confirmation of the chosen options. Continuing with this example, the system may analyze and perform various processes with the interfaces of the cinema reservation service to determine integration code to reserve a movie with food and drink. Continuing with this example, the integration code may cause an entity to select desired options through the appropriate candidate second interface object, add/confirm the desired options through the first interface object, and present the resulting second user interface to the entity. Additionally, in various embodiments, the integration code may be implemented as a model or code that otherwise models the customization process.

In 722, the system may provide the integration code to a client device application. In some embodiments, the integration code is provided in response to a request by the client device (e.g., via an application executing on the client device) for the integration code for the interface provider. In some examples, the system may provide the integration code to one or more remote servers, which may provide the code to various devices and/or applications. Note that one or more of the operations performed in 702-22 may be performed in various orders and combinations, including in parallel.

The integration code, upon execution, may cause a device to engage with corresponding interface objects and user interfaces of different first interfaces by the same interface provider. Note, however, that the process 700 may need to be performed for multiple first user interfaces of the interface provider to obtain additional correlation that the correct second interface object has been identified and correctly corresponds to the new listed selection in order to provide sufficient certainty that the correct interface objects have been identified.

Figure 8:
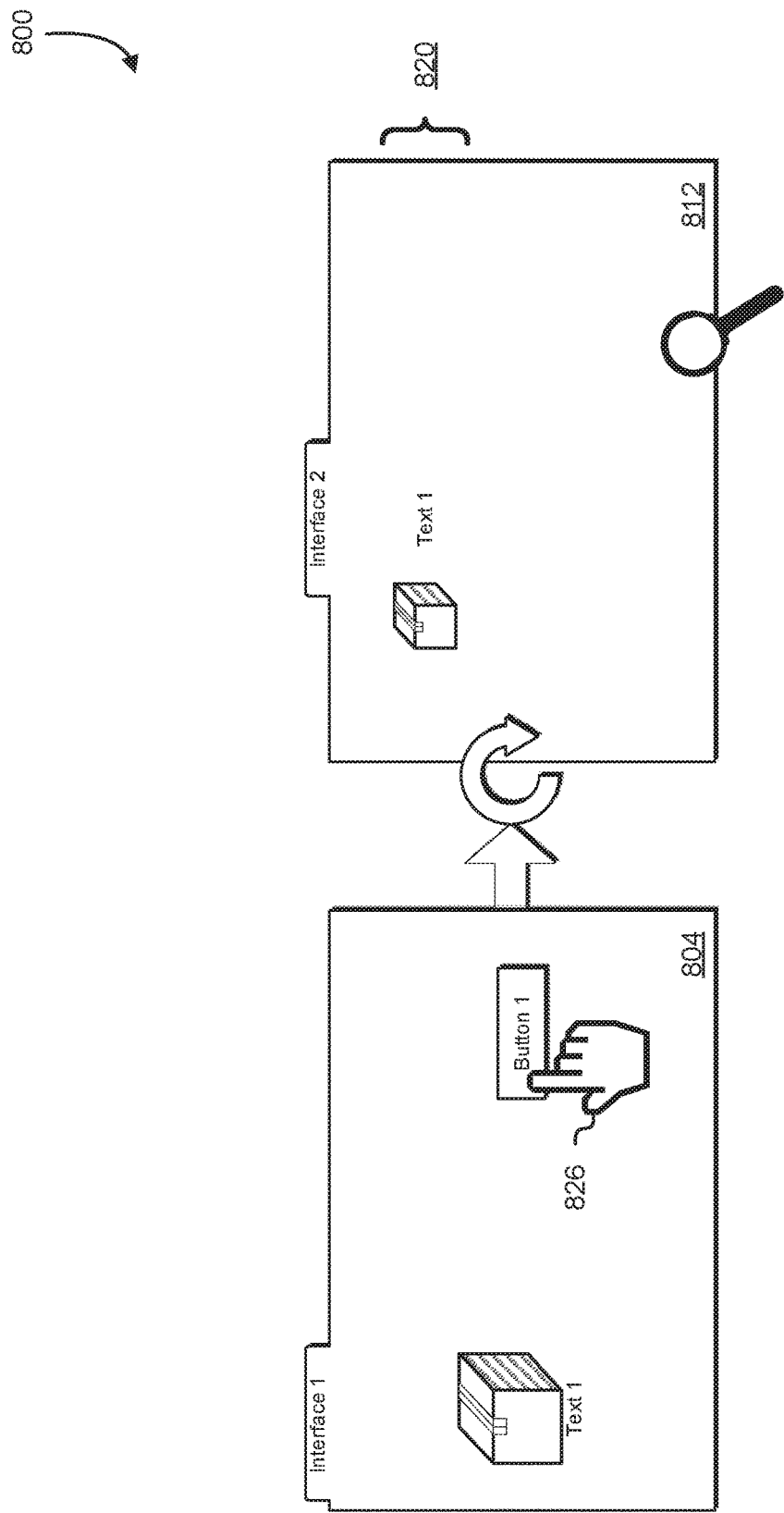
FIG. 8 illustrates an example of identifying an element in an interface added from a different interface in accordance with an embodiment.

FIG. 8 illustrates an example 800 of identifying an element in an interface that may have been added to a different interface, in accordance with an embodiment. As illustrated in FIG. 8, the example 800 includes a first interface 804, which may be interacted with through a simulated human interaction 826. The example 800 also includes a second interface 812, which may be associated with the first interface 804, that comprises interface elements 820.

The first interface 804 may be an interface of an interface provider, which may provide various customizable services. The first interface 804 may be similar to the first interface 104 of FIG. 1 or the initial interface 206 of FIG. 2. The second interface 812 may be a different interface of the interface provider and may denote various information originating from the first interface 804. The second interface 812 may be similar to one of the set of second interfaces 112 of FIG. 1 or one of the set of candidate interfaces 212 of FIG. 2. As an illustrative example, the interface provider may be a library organization, in which the first interface 804 may be a listing of books, and the second interface 812 may denote books selected to be borrowed.

In some examples, elements of the first interface 804 may be associated with elements of the second interface 812, and vice versa. For example, the selection of an element on the first interface 804 may affect a value displayed on the second interface 812 and/or interface elements 820. In order for an integration code generator, such as the integration code generator 102 as described in connection with FIG. 1, to identify the process in which an element is added into another interface so as to generate integration code capable of interpreting and engaging with the various interface elements of the first interface and the second interface, the integration code generator 102 or similar entity may attempt to identify an element of the second interface that is dependent on an element of the first interface.

The integration code generator may perform one or more processes to obtain the first interface 804 and/or the second interface 812 (e.g., such as the processes 400 and 500 of FIGS. 4 and 5). In some examples, the integration code generator may be provided with the first interface 804 and the second interface 812. In some examples, the integration code generator may utilize an input from the entity to obtain the first interface 804. The integration code generator may analyze the first interface 804. In some examples, the integration code generator may utilize various keyword searches, regular expressions, digital image recognition algorithms, neural networks, and/or machine learning algorithms to detect and identify elements of the first interface 804 (e.g., by passing a set of interface element nodes identified as input to one or more machine learning classifiers in order to classify interface element nodes). The integration code generator may determine if any elements of the first interface 804 match any potentially known elements. The integration code generator may determine that the selection of one or more elements of the first interface 804 may result in the executing of the second interface 812, and utilize the one or more elements to obtain the second interface 812.

The integration code generator may then analyze the first interface 804 to determine a set of text/digital image pairs. In some examples, the integration code generator may utilize the source code of the first interface 804 to determine the set of text/digital image pairs. The integration code generator may determine the set of text/digital image pairs based on any text/digital image pair elements of the first interface 804. The integration code generator may further analyze the first interface 804 to determine one or more elements that may affect the second interface 812. The integration code generator may utilize various classification processes to determine that the element reading "Button 1" of the first interface 804 may affect the second interface 812. The element "Button 1" may be a button object or other interface control. The integration code generator may utilize the simulated human interaction 826 to select the element reading "Button 1." The simulated human interaction 826 may be any hardware or software that enables the integration code generator to simulate human interaction to interact with a desired interface. In some examples, the simulated human interaction 826 may be implemented by simulating (e.g., via execution of event handlers, such as onClick, onMouseOver, onMouseOut, onKeyDown, etc.) a pointer or mouse cursor.

The integration code generator may then refresh the second interface 812. In various embodiments, the integration code generator may refresh the second interface 812 through one or more processes that may refresh or otherwise update the second interface 812 to reflect any changes that may have occurred due to the simulated human interaction 826.

The integration code generator may analyze the interface elements 820 of the refreshed second interface 812 to determine all of the text/digital image pair elements present in the refreshed second interface 812. In various embodiments, the integration code generator may determine that the text/digital image pair element reading "Text 1" is present in the refreshed second interface 812. In some examples, the system may compare the refreshed second interface 812 to a previous, un-refreshed version of the second interface 812, which the system may have stored prior to refreshing the second interface 812, to determine if any new text/digital image pair elements have been generated. The integration code generator may iterate through the previously determined set of text/digital image pairs of the first interface 804, and determine if any text/digital image pairs of the first interface 804 match any text/digital image pair elements of the refreshed second interface 812.

The integration code generator may determine that the text/digital image pair element "Text 1" of the first interface 804 matches the text/digital image pair element "Text 1" of the second interface 812. The integration code generator may then further determine that the selection of the element reading "Button 1" of the first interface 804 caused the text/digital image pair element "Text 1" to be added to the second interface 812. The integration code generator may then generate integration code based upon the determined information. In some examples, integration code may be code that models the elements of the various interfaces. In some examples, the integration code may be executable code that may performs a process. In some examples, the integration code may comprise functions that allow an entity to streamline various processes within one or more interface providers. As an illustrative example, the interface provider may be a library organization. Continuing with this example, the first interface 804 may be a listing of books, which may be selected to be borrowed with the element reading "Button 1." Continuing with this example, the second interface 812 may be an interface that displays books selected to be borrowed. Continuing with this example, the integration code generator may analyze and perform various processes with the interfaces of the library organization to determine integration code to select a book to be reserved. Continuing with this example, the integration code may cause an entity to select a book, represented by a text/digital image pair element, add the selected element representing the book through the "Button 1" element, and view the resulting interface elements 820 of the second interface 812 displaying the selected book.

---
Algorithm III: Location and Extraction of Item Elements in a User Interface
---

Algorithm takes as input several first interfaces (at least 3). Start from one of these interfaces.

Fix a "tolerance threshold" that is given as a parameter to the algorithm—In embodiments, this is the number of input first interfaces minus 2.
1) On the first of the first interfaces, identify all elements that approximately match a particular element type (this collection is referred to as the "particular element candidates"). These are elements on an interface, characterized by a CSS selector. These elements are akin to location descriptors—their value changes from first interface to another first interface, but their location is the same on all first interfaces (the particular element value of particular element changes from interface to interface, but the position of the element—e.g., the box where the particular element value is presented—is the same). These descriptors can be XPath selectors, or CSS selectors.
2) Extract a candidate for what could be a pair of second and first buttons. The list of "listed selection candidates" is at this point empty. The list of "particular element candidates" is at this point empty.
3) Save a "snapshot" of the second interface (a representation of the interface at this time, containing its rendered HTML, metadata, etc.). Extract all interface elements that approximately match the particular element type (e.g., determined by heuristics).
   a. If there are no first interfaces left, continue at step 8.
4) Engage first button.
5) Refresh the second interface. Again, extract all interface elements that approximately match the particular element type. Match these interface elements to the interface elements in the snapshot of the second interface at step 3) (this is done using XPath and CSS selectors of the elements). In essence, at this step, we simply identify which elements were present in the second interface before engaging the first button, and which elements appeared afterwards.
6) Add the new elements of the particular type to the list of listed selection candidates.
7) From all listed selection candidates, keep the ones whose value is contained by the one of the "particular element candidates" (e.g., by matching the CSS selector of the elements) on any of the first interfaces seen so far. "Particular element candidates" whose value is not matched by any of the listed selection candidates are removed from the "particular element candidates" collection. Repeat from step 3).
8) Infer the "item element node" as the lowest common ancestor of the elements remaining in the "listed selection candidates" list. And the "listed selection containers" as the children of this node. The each "listed selection container" then corresponds to the box containing information corresponding to a listed selection together with the corresponding price on a first interface from the matching in step 7). Since the information on the different first interfaces is different, each listed selection is matched to one first interface.
9) Now, for each first interface and matching listed selection container, we find the pairs of elements with matching text (if several such elements exist, we break ties by picking the largest text and further, the longest text). If different elements are identified as containing information for several listed selection containers, a majority vote decides the element to be used. The same matching procedure is repeated for the listed selection digital image.

Figure 9:
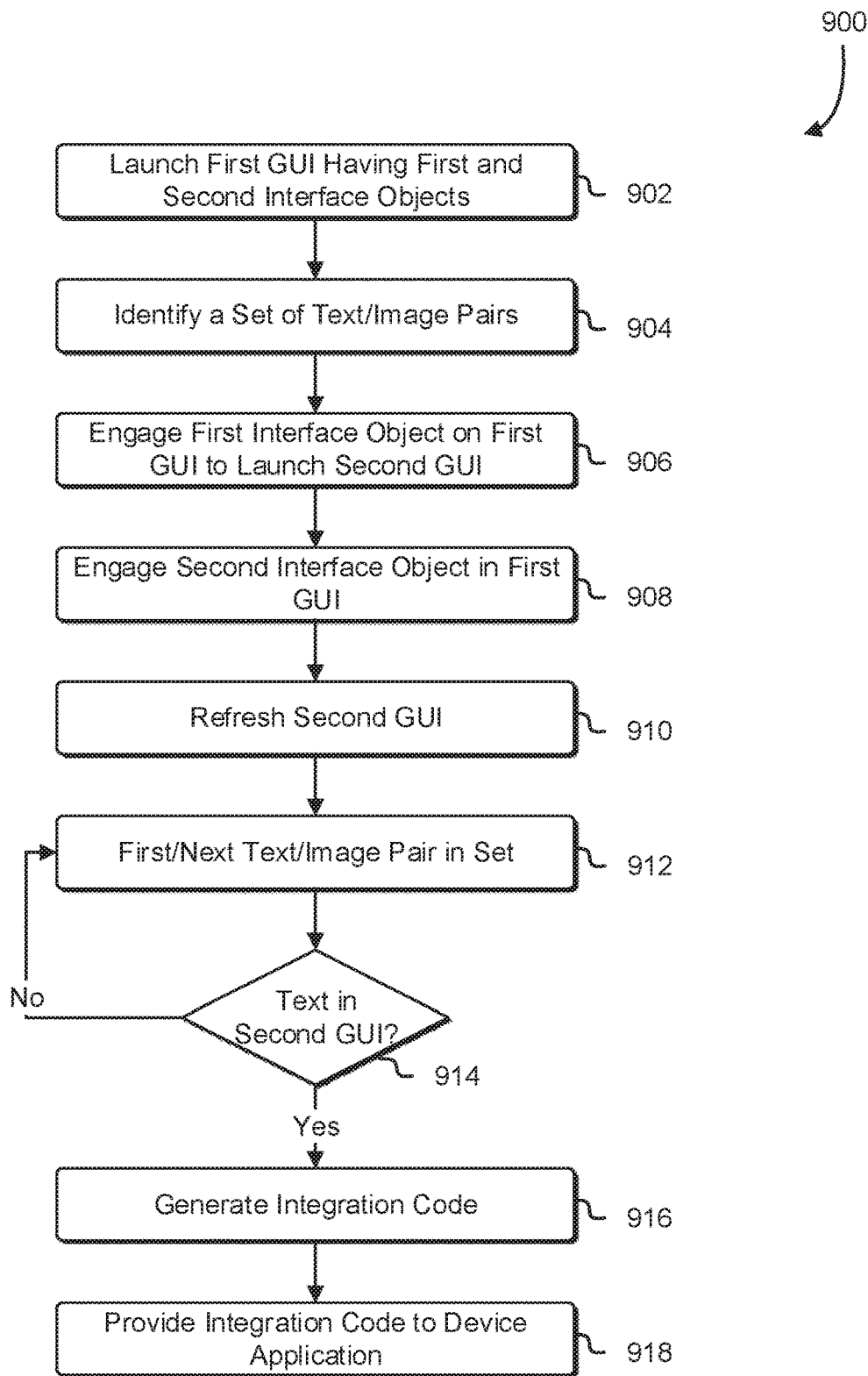
FIG. 9 is a flowchart that illustrates an example of identifying an element in an interface added from a different interface in accordance with an embodiment.

FIG. 9 is a flowchart illustrating an example of a process 900 for identifying an element in an interface that may have been added to a different interface, in accordance with various embodiments. Some or all of the process 900 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash media). For example, some or all of process 900 may be performed by any suitable system, such as the computing device 1300 of FIG. 13. The process 900 includes a series of operations wherein a first user interface having first and second interface objects is executed, a set of text/digital image pairs is identified, the first interface object is engaged to execute a second user interface, the second interface object is also engaged, the second user interface is then refreshed, and, for each of the text/digital image pairs, it is determined whether the text (and/or digital image) appears in the second user interface. After identifying text/digital image pairs that appear in the second user interface after the second interface object is engaged, integration code is generated and provided in response to a request from an application running on a client device. The system performing the process 900 may be a system such as the integration code generator 102 as described in connection with FIG. 1.

In 902, the system may execute a first user interface having first and second interface objects. The first user interface may be an interface of an interface provider, such as the first interface 104 of FIG. 1 or the initial interface 206 of FIG. 2, which may provide various services as described in the present disclosure. The system may identify the first and second interface objects. The system may analyze the first user interface to determine the functions and identities of the first and second interface objects. In some examples, the first interface object may cause the execution of a second user interface. The process for identifying the first interface object may be similar to the processes 400 and 500 described in conjunction with FIGS. 4 and 5. Additionally, in some examples, the system may determine that the second interface object affects one or more elements of the second user interface. In some examples, the first and/or second interface objects may be identified through the usage of various classification algorithms/processes to determine if the objects match any known elements capable of executing the second user interface.

In 904, the system may identify a set of text/digital image pairs. The system may analyze the first user interface and determine the set of text/digital image pairs. In some examples, a text/digital image pair is an element that comprises text paired with a digital image. For example, a digital image of a book accompanied with text denoting the name of the book may be considered a text/digital image pair. In various embodiments, a text/digital image pair may be a single element, combination of elements, and/or variations thereof. In some examples, the system may parse the source code of the first user interface to determine the set of text/digital image pairs. Note that in various examples the set is referred to as a set of pairs for ease of explanation, and it is contemplated that the set may comprise more than two dimensions. For example, the set may be of a set of text/digital image/value triplets, such as a digital image of a book, a name of the book, and a number of chapters of the book. It is also contemplated that the types of data in the set may include any combination of text, digital images, or values, or even other media types as applicable (e.g., audio, video, etc.).

In 906, the system may engage the first interface object on the first user interface to execute the second user interface. The system may engage with the first interface object through various processes, such as a simulated human interaction. The system may then, in 908, engage the second interface object in the first user interface. In various embodiments, the system may have determined that the second interface object affects the second user interface. In 910, the system may refresh the second user interface. The system may refresh the second user interface by reloading the second user interface, obtaining an updated second user interface from one or more interface providers, or otherwise any process that may update the second user interface in response to engaging the second interface object.

In 912, the system may iterate through the previously determined set of text/digital image pairs. The system may first analyze the second user interface to determine any text/digital image pair elements (or whatever combined elements of the set may be according to the particular implementation). In various embodiments, the system may analyze the second user interface and determine that after the second user interface was refreshed, a new text/digital image pair element has been generated and is present in the second user interface. In 914, the system may compare the new text/digital image pair with the set of text/digital image pairs from the first user interface. If the new text/digital image pair does not match a text/digital image pair from the set of text/digital image pairs from the first user interface, the system may return to 912 to repeat the operations of 912-14 until a match is found. On the other hand, if the new text/digital image pair does match a text/digital image pair from the set of text/digital image pairs from the first user interface, the system may proceed to 916.

In this manner, the system may identify the matching text/digital image pair from the first user interface and the second user interface. The system may further determine that engaging the second interface object in the first user interface caused the matching text/digital image pair from the first user interface to be generated in the second user interface. The system may generate one or more models that may model this process and/or various other functionalities of the interfaces. The system may then, in 916, generate integration code based upon the determined information (e.g., based on metadata about matching text/digital image pair (e.g., object types, identifiers, attributes, locations in the second user interface source code, proximity to other elements, etc.) in the second user interface).

In some examples, the integration code as described throughout the present disclosure may be executable code that performs a selection process. In some examples, the integration code may comprise functions that allow an entity to streamline selection processes within one or more interface providers. As an illustrative example, the interface provider may be a library organization. Continuing with this example, the first user interface may be an interface depicting a listing of books, which may be selected to be borrowed with the second interface object. Continuing with this example, the second user interface may be an interface that displays books selected to be borrowed. Continuing with this example, the system may analyze and perform various processes with the interfaces of the library organization to determine integration code to select a book to be reserved. Continuing with this example, the integration code may cause an entity to execute the first user interface, execute the second user interface through engaging the first interface object, select a book represented by a digital image/text pair element, add the selected book through engaging the second interface object, and refresh and view the second user interface displaying the selected book. In various embodiments, the integration code may be implemented as a model or code that otherwise models the selection process.

In 918, the system may provide the integration code to a client device application. In some embodiments, the integration code is provided in response to a request by the client device (e.g., via an application executing on the client device) for the integration code for the interface provider. In various embodiments, the client device application may cause the generation of the integration code. In some examples, the system may provide the integration code to one or more remote servers, which may provide the code to various devices and/or applications. The client device application may execute the integration code as part of one or more processes. Note that one or more of the operations performed in 902-18 may be performed in various orders and combinations, including in parallel.

The integration code may, upon execution, cause a device to engage with corresponding interface objects and user interfaces of different first interfaces by the same interface provider. Note, however, that the process 900 may need to be performed for multiple first user interfaces of the interface provider to obtain additional correlation that the correct elements corresponding to the matching text/digital image pairs have been identified in order to provide sufficient certainty that the correct interface objects have been identified.

Figure 10:
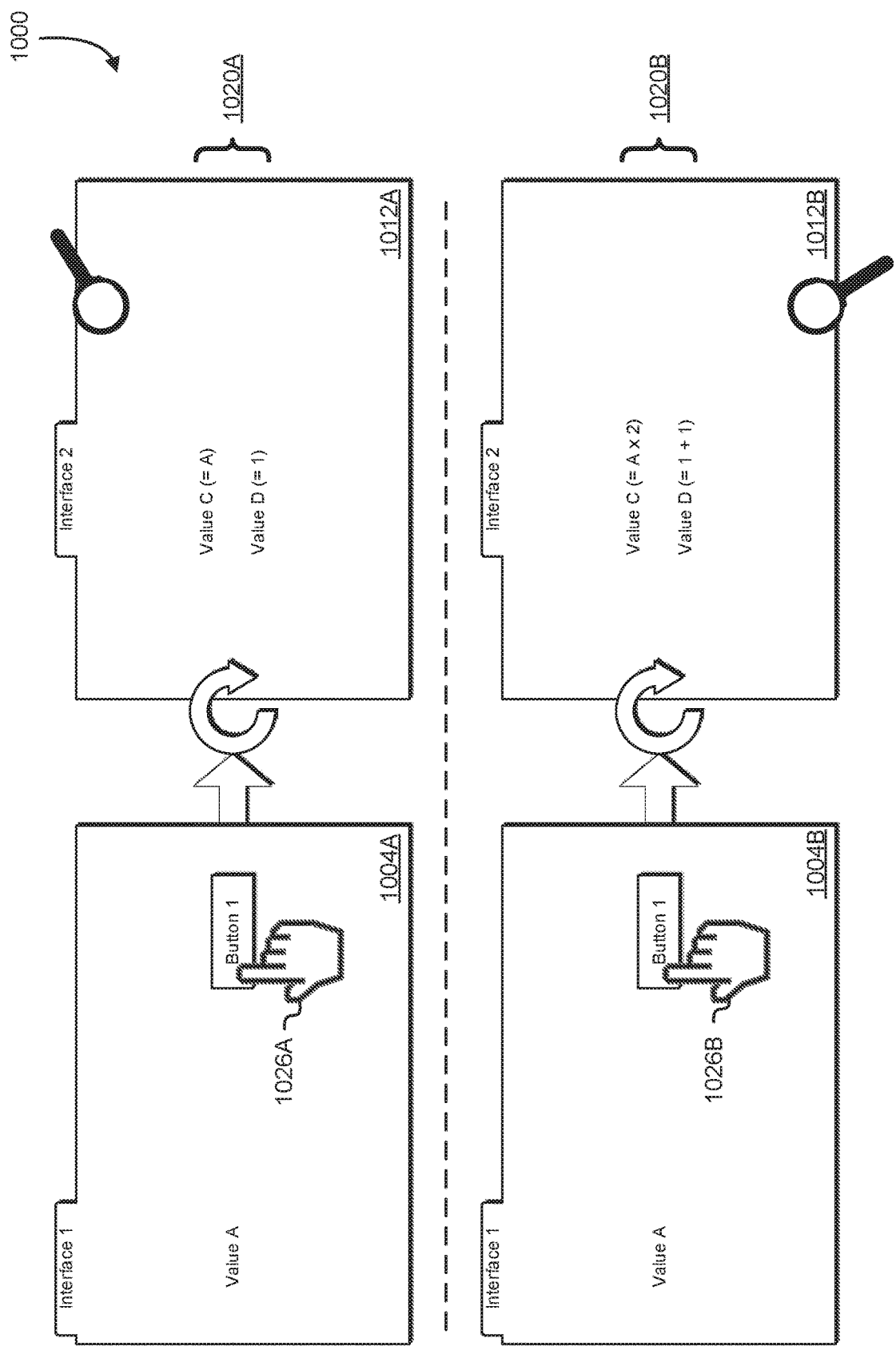
FIG. 10 illustrates an example of identifying values in one interface that are dependent upon an element in another interface, in accordance with an embodiment.

FIG. 10 illustrates an example 1000 of identifying values in one interface that are dependent upon an element in another interface, in accordance with an embodiment. As illustrated in FIG. 10, the example 1000 includes a first interface at a first time 1004A, which may be associated with an initial second interface 1012A. The initial second interface 1012A may also include interface elements at the first time 1020A, which may be affected by a first simulated human interaction 1026A with the first interface. The example 1000 also includes a first interface at a second time 1004B, which may be associated with a refreshed second interface 1012B. The first interface at the second time 1004B may be similar to the first interface 104 of FIG. 1 or the initial interface 206 of FIG. 2. The refreshed second interface 1012B may also include interface elements at the second time 1020B, which may be affected by a second simulated human interaction 1026B with the first interface.

The first interface at a first time 1004A may be an interface of an interface provider, which may provide various customizable services as described in the present disclosure. The first interface at the first time 1004A may be similar to the first interface 104 of FIG. 1 or the initial interface 206 of FIG. 2. The initial second interface 1012A may be a different interface of the interface provider, and may denote various information originating from the first interface at a first time 1004A. As an illustrative example, the interface provider may be a library organization, in which the first interface at a first time 1004A may be a book listing, comprising information regarding potential books such as number of chapters, genre, and/or variations thereof. Continuing with this example, the initial second interface 1012A may be an interface that, through the interface elements at the first time 1020A, displays characteristics and quantities of selected books.

In some examples, elements of the first interface at a first time 1004A may be associated with elements of the initial second interface 1012A, and vice versa. For example, the selection of an element on the first interface at a first time 1004A may affect a value displayed on the initial second interface and/or the interface elements at the first time 320A. In order for an integration code generator, such as the integration code generator 102 as described in connection with FIG. 1, to generate integration code capable of interpreting and engaging with the various interface elements of the first interface and the second interface, the integration code generator 102 or similar entity may attempt to identify an element of the initial second interface 1012A that is dependent on an element of the first interface at a first time 1004A.

The integration code generator may perform one or more processes to obtain the first interface at a first time 1004A. In some examples, the integration code generator may be provided with the first interface at a first time 1004A and/or the initial second interface 1012A. In some examples, the integration code generator may utilize an input from the integration code generator to obtain the first interface at a first time 1004A. The integration code generator may analyze the first interface at a first time 1004A. In some examples, the integration code generator may utilize various keyword searches, regular expressions, digital image recognition algorithms, neural networks, and/or machine learning algorithms to detect and identify elements of the first interface at a first time 1004A (e.g., by passing a set of interface element nodes identified as input to one or more machine learning classifiers in order to classify interface element nodes). The integration code generator may determine if any elements of the first interface at a first time 1004A match any potentially known elements. The integration code generator may determine that the selection of one or more elements of the first interface at a first time 1004A results in the initial second interface 1012A. The integration code generator may additionally determine that the selectable element "Button 1" may affect the initial second interface 1012A. The integration code generator may engage the element "Button 1" utilizing the first simulated human interaction 1026A to produce the initial second interface 1012A. The element "Button 1" may be a button object or other interface control. The first simulated human interaction 1026A may be hardware or software that enables the integration code generator to simulate human interaction to interact with a desired interface. In some examples, the first simulated human interaction 1026A may be implemented by simulating (e.g., via execution of event handlers, such as onClick, onMouseOver, onMouseOut, onKeyDown, etc.) a pointer or mouse cursor.

The integration code generator may save the current state of the initial second interface 1012A. In some examples, the first interface at a first time 1004A and the initial second interface 1012A may be Internet markup language interfaces written in HTML. In various embodiments, a representation of both the initial second interface 1012A may be stored by the integration code generator. The integration code generator may analyze the initial second interface 1012A and determine that the element depicting "Value C" corresponds to the element reading "Value A," and that the first simulated human interaction 1026A of the selectable element reading "Button 1" of the first interface at a first time 1004A caused the "Value C" to correspond with the value "A" (on refresh of the initial second interface 1012A).

The integration code generator may utilize the second simulated human interaction 1026B to engage the element "Button 1" again. The integration code generator may refresh the initial second interface 1012A to obtain the refreshed second interface 1012B. In some examples, the refreshed second interface 1012B may be obtained by refreshing or otherwise updating the initial second interface 1012A.

The integration code generator may compare the refreshed second interface 1012B with the stored representation of the initial second interface 1012A. The integration code generator may determine that the interface elements at the second time 1020B have been updated from the interface elements at the first time 1020A, and further determine that the changes have resulted in the value "C" now being twice the value of "A" and that the value "D" has incremented by 1 as a result of the second engaging of the element reading "Button 1." Consequently, the integration code generator may determine that the selection of the element reading "Button 1" adds the value specified in the element "Value A" to the value specified by the element "Value C," and the value specified by the element "Value D" represents the quantity of element "Value A" that has been added by utilizing the element "Button 1."

Based upon the determination, the integration code generator may generate integration code that models the elements of the various interfaces. In some examples, the integration code may be executable code that performs a process. In some examples, the integration code may comprise functions that allow an entity to streamline one or more processes within one or more interface providers. As an illustrative example, the interface provider may be a library organization. Continuing with this example, the first interface may be a book listing, comprising information regarding potential books such as number of chapters, genre, and/or variations thereof. Continuing with this example, the second interface may be an interface that displays characteristics and quantities of selected books. Continuing with this example, the value specified by element "Value D" may be the quantity of selected books, and the value specified by element "Value C" may be the total number of chapters of the selected books. Continuing with this example, the integration code generator may analyze and perform various processes with the interfaces of the library organization to determine integration code to select two copies of a book to be borrowed. Continuing with this example, the integration code may cause an entity to determine the desired book, add the desired book twice through the "Button 1" element, and view the resulting interface elements of the second interface displaying the added books as well as characteristics of the added books such as the quantity of added books and total number of chapters of the added books, which may be depicted by elements "Value D" and "Value C," respectively.

---

Algorithm IV: Unsupervised Location and Extraction of Quantity and Unit Value Elements in a User Interface

---

Note: Since now a method of detecting the listed selection element containers (Algorithm III) is described above, getting the listed selection value is simply applying the method for location and extraction of a user element state (Algorithm I) within the container of the listed selection element (we pretend the box containing a listed selection element is a small second interface and find the listed selection value by adding the same listed selection repeatedly).

Algorithm takes as input a threshold, a first interface, a second button and a first button on this interface and a method for detecting listed selection elements on the second interface.
1) Engage the second button to add a listed selection to the second interface.
2) Engage the second button again. If there is an element in the listed selection element container whose text is a number and increased by 1, mark as a candidate and increment its rank. If the element is new, assign a rank value of 1. As in previous cases, the persistence of elements is checked with CSS or) XPath selectors.
3) Repeat step 2) until threshold is reached (a threshold of 3 to 5 is enough in some cases).
4) Return element with highest rank.

Figure 11:
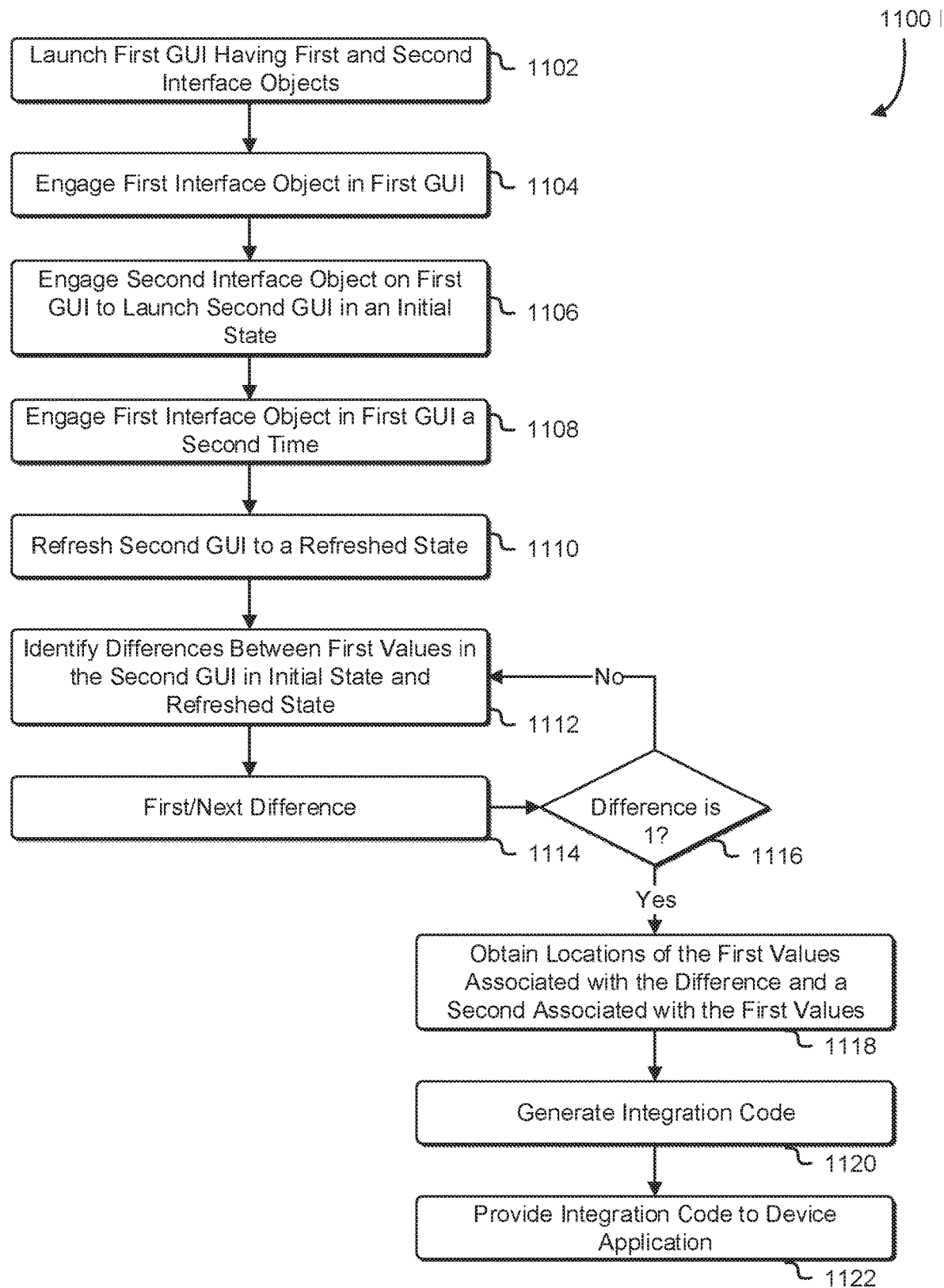
FIG. 11 is a flowchart that illustrates an example of identifying values in one interface that are dependent upon an element in another interface in accordance with an embodiment.

FIG. 11 is a flowchart illustrating an example of a process 1100 for identifying values in one interface that are dependent upon an element in another interface, in accordance with various embodiments. Some or all of the process 1100 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash media). For example, some or all of process 1100 may be performed by any suitable system, such as the computing device 1300 of FIG. 13. The process 1100 includes a series of operations wherein a first user interface having first and second interfaces objects is executed, the first interface object is engaged, and then the second interface object is engaged to execute a second user interface, an initial state of the second user interface is obtained, the first interface object is engaged a second time, and then the second user interface is refreshed and compared with the initial state. Based on the comparison, locations of an element whose a value is associated with a value in the first user interface and an element whose value increments by 1 are determined, and integration code is generated based on the determination. The system performing the process 1100 may be a system such as the integration code generator 102 as described in connection with FIG. 1.

In 1102, the system may execute a first user interface, which may be denoted as a first user interface, having first and second interface objects. The first user interface may be an interface of a service provider, which may provide various services as described in the present disclosure. The system may identify the first and second interface objects. The system may analyze the first user interface to determine the functions and identities of the first and second interface objects. In some examples, the second interface object may, as a result of being engaged (e.g., by simulating human interaction) cause the execution of a second user interface. Additionally, in some examples, the system may determine that the first interface object affects one or more elements of the second user interface. In some examples, the first and/or second interface objects may be identified through the usage of various classification algorithms/processes to determine if the first and/or second interface objects match any potentially known elements.

In 1104, the system may engage the first interface object in the first user interface. In some examples, the system may simulate human interaction to engage with the first interference object. In various embodiments, simulated human interaction refers to hardware or software that causes the system to simulate human interaction with a particular interface. In some examples, simulated human interaction may be implemented by simulating (e.g., via execution of event handlers, such as onClick, onMouseOver, onMouseOut, onKeyDown, etc.) a pointer or mouse cursor. In 1106, the system may engage the second interface object on the first user interface to execute the second user interface in an initial state. The system may engage the second interface object by simulating human interaction. In 1108, the system may engage the first interface object in the first user interface a second time. In 1110, the system may refresh the second user interface to a refreshed state. In some examples, the system may update the second user interface to obtain the refreshed state of the second user interface.

The system may then analyze the initial state and refreshed state of the second user interface. The system may determine a set of first values of the second user interface. In various embodiments, the set of first values may be present in both the initial state and the refreshed state of the second user interface, although in some examples, one or more values of the set of first values may be different between the initial state and the refreshed state of the second user interface. In 1112, the system may identify differences between values of the set of first values in the second user interface in the initial state and the refreshed state. In some examples, the system may compare a value in the refreshed state with a value in the initial state to determine a difference of the values. The system may compare a value of the set of first values in the initial state with each value of the set of first values in the refreshed state, and vice versa, to identify differences. The system may, in 1114, iterate through the first/next differences of the values. In 1116, the system may determine whether the difference between the value of the set of first values is equal to the value 1. If the difference is not equal to the value of 1, the system performing the process 1100 may return to 1112 repeat the operations of 1112-16 until a difference of 1 is found. On the other hand, if the system identifies a difference with the value of 1, the system may proceed to 1118.

In 1118, the system may obtain locations of the first values associated with the difference and a second value associated with the first values. In some examples, the system may determine that the second value may be associated with the first values such that the second value may change with the first value. In some examples, the system may determine that the first interface object in the first user interface may cause the second value to change along with the first values. The system may determine that engaging the first interface object causes the first values to increase by 1 and the second value to increase by a fixed quantity. The system may further determine that the first values represent a quantity of an element, and the second values represent a value of the element. The system may generate one or more models that may model the interface objects and/or various other functionalities of the interfaces.

In 1120, the system may generate integration code based on metadata about the element corresponding to the quantity and listed selection value (e.g., object types, identifiers, attributes, locations in the second user interface source code, proximity to other elements, etc.) in the second user interface. In some examples, the integration code may be based upon the determined information. The integration code may be executable code that performs one or more processes. In some examples, the integration code may comprise functions that allow an entity to streamline processes within one or more interface providers. As an illustrative example, the interface provider may be a library organization. Continuing with this example, the first interface may be a book listing, comprising information regarding potential books such as number of chapters, genre, and/or variations thereof. Continuing with this example, the second interface may be an interface that displays characteristics and quantities of selected books. Continuing with this example, the first value may be the quantity of selected books, and the second value may be the total number of chapters of the selected books. Continuing with this example, the system may analyze and perform various processes with the interfaces of the library organization to determine integration code to select two copies of a book to be borrowed. Continuing with this example, the integration code may cause an entity to determine the desired book, add the desired book twice by engaging with the first interface object, and view the second user interface displaying the added books. In various embodiments, the integration code may be implemented as a model or code that otherwise models the selection process.

In 1122, the system may provide the integration code to a client device application. In various embodiments, the client device application may cause the generation of the integration code. In some examples, the system may provide the integration code to one or more remote servers, which may provide the code to various devices and/or applications. The client device application may execute the integration code as part of one or more processes. Note that one or more of the operations performed in 1102-22 may be performed in various orders and combinations, including in parallel.

The integration code may, upon execution, cause a device to engage with corresponding interface objects and user interfaces of different first interfaces by the same interface provider. Note, however, that the process 1100 may need to be performed for multiple first user interfaces of the interface provider to obtain additional correlation that the correct elements corresponding to the quantity and listed selection value have been identified in order to provide sufficient certainty that the correct interface objects have been identified.

Figure 12:
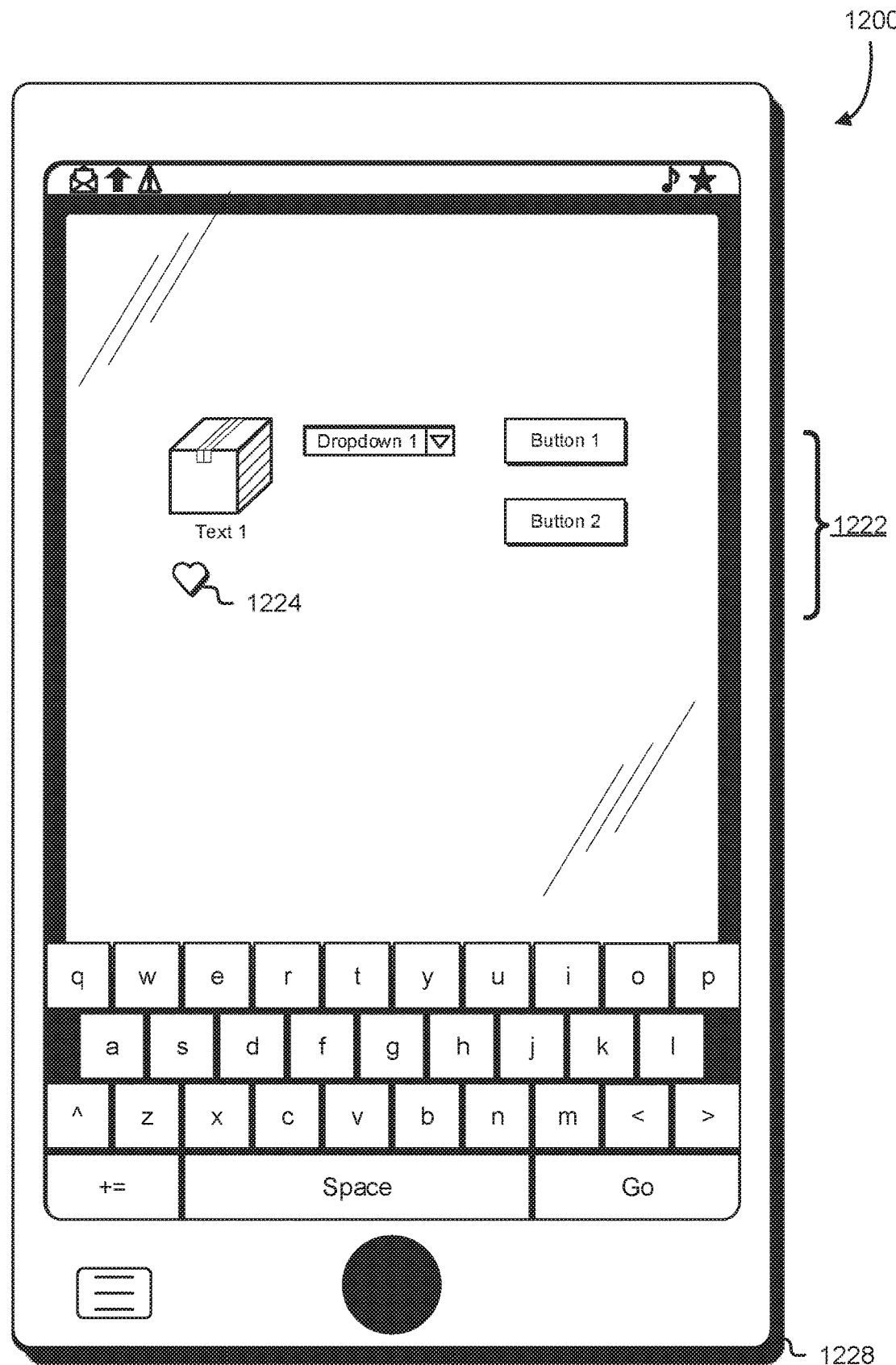
FIG. 12 illustrates an example of an interface on a client device in accordance with an embodiment.

FIG. 12 illustrates an example interface 1200 of an application running on a client device 1228. The example interface 1200 may comprise interface elements 1222, including a bookmark interface element 1224. The interface elements 1222 may be elements that allow an entity to interact/engage with the example interface 1200. The bookmark interface element 1224 may perform various functionalities, such as saving a state of a configuration of the interface elements 1222, transmitting a state of a configuration of the interface elements 1222 to one or more systems for further processing, and/or variations thereof. The client device 1228 may be a computing device, such as the client device 216 of FIG. 2 or the computing device 1300 of FIG. 13, and the application may be a software application, such as a browser, capable of causing the execution of integration code described in the present disclosure. The application may, as a result of running on the client device 1228, display the example interface 1200 of the interface provider on the client device 1228, and may further display one or more of its own graphical overlays on top of or in lieu of the example interface 1200 of the interface provider.

In some examples, the example interface 1200 may be an interface of an interface provider, which may provide various services as described in the present disclosure and the interface elements 1222 may allow an entity to select and configure various elements. The application running on the client device 1228 may obtain integration code from a system, such as the integration code generator 102 as described in connection FIG. 1, that, upon execution by the client device 1228 may streamline one or more processes of involving the example interface 1200. For example, execution of the integration code via the application running on the client device 1228 may cause the client device to interact with the interface element 1222 of the interface provider.

Continuing with this example, the entity may utilize the integration code to perform one or more processes. Continuing with this example, the one or more processes may comprise executing the integration code to cause selection of an option from the "Dropdown 1" element, engaging the "Button 1" and "Button 2" elements, and selection of the bookmark interface element 1224. The "Button 1" and "Button 2" may be button objects or other interface controls. The bookmark interface element may be an interface element that, in response to being engaged, may cause the client device to bookmark, save, or otherwise store the selected elements/configurations. In some embodiments, the client device may request integration code for a particular interface provider and the system (e.g., the integration code generator) may not yet have integration code generated for that particular interface provider; in such a case, the system may perform one or more of the processes described in the present disclosure (e.g., processes 400, 500, 700, 900, and 1100 of FIGS. 4, 5, 7, 9, and 11 respectively) in order to generate and provide the integration code to the client device 1228 in real-time.

As an illustrative example, the interface provider may be a library organization. Continuing with this example, the example interface 1200 may be a markup language interface of the library organization that allows an entity to select and borrow a book. In this example, a user may desire to select and borrow a specific book and may make the appropriate selections of the interface elements 1222 to add the book to a queue. In this example, however, the user may decide to wait and finish the borrowing process for the book at a different time. The user may engage the bookmark interface element 1224 to store the current configuration information in volatile storage such as random access memory (RAM), or non-volatile (i.e., persistent) storage, such as flash memory or magnetic media. In some embodiments, such configuration information may be stored in persistent storage on the client device or at a server of an entity that hosts the integration code generator. Continuing with this example, the user may decide to resume the borrowing process and restore the selection from storage at the different time; however, at the different time, the previous session with the library organization may be expired. Consequently, the application (via the client device) may request integration code from a system such as the integration code generator 102 of FIG. 1, whereupon the system may generate (if not already generated) integration code for the library organization and provide the integration code to the client device. Execution of the integration code by the client device may cause the client device to retrieve the configuration information previously stored in response to the user engaging the bookmark interface element 1224 and dynamically re-select the appropriate interface element options in accordance with the configuration information. In some implementations, the re-selection of the appropriate interface elements may be hidden by an overlay of the application, may be performed in a background process of the client device 1228, or otherwise be hidden from the user.

In some embodiments, the application running on a first client device may allow the stored configuration information to be shared with an additional user even for interfaces that lack such intrinsic sharing capability. The other user may download and install an additional copy of the application to a second client device, and the application may share the stored information with the additional application running on the second client device. For example, stored configuration information may be shared by sending a link (e.g., a Uniform Resource Identifier) in a message (e.g., text message, e-mail message, etc.) to an address associated with the second client device. Engaging with (e.g., clicking, touching, or otherwise selecting the link) may cause the second client device to download or otherwise obtain the shared configuration information. In response to receiving the shared configuration information, the additional application may restore the selection and resume the process in a similar manner as the first client device could have.

In some, alternative examples, the example interface 1200 may be a simplified interface to an interface provider, and may be generated by the application running on the client device 1228. Continuing with this example, the example interface 1200 may comprise various elements of one or more interfaces of the interface provider, and may provide a simplified view of the one or more interfaces. Continuing with this example, the system may have previously generated sets of integration codes to execute various processes utilizing the one or more interfaces of the interface provider. Continuing with this example, an entity may utilize the interface elements 1222 to select a configuration from the "Dropdown 1" element, engage with the "Button 1" and "Button 2" elements, and select the bookmark interface element 1224. Continuing with this example, the system may retrieve the appropriate integration code, and execute one or more processes to complete various tasks which may be specified by engaging the interface elements 1222 by the entity.

As an illustrative example, the interface provider may be a library organization. Continuing with this example, the example interface 1200 may provide a simplified view of one or more interfaces of the library organization. Continuing with this example, the example interface 1200 may provide the essential elements to select and borrow a book through the interface elements 1222. Continuing with this example, an entity may utilize the interface elements 1222 to select a book to be borrowed. Continuing with this example, the system may utilize the inputs to the interface elements 1222 to perform one or more processes, which may be executed through generated and/or retrieved integration codes, to select and borrow the book utilizing one or more other interfaces of the library organization on behalf of the entity. Continuing with this example, the entity may decide to borrow the book at a later time, and utilize the bookmark interface element 1224 to bookmark the specific book. Continuing with this example, the system may store any integration codes that may potentially be utilized to borrow the specific book, and utilize the integration codes at the later time.

It is contemplated that other types of applications and devices (e.g., client-side, server-side, etc.) may utilize/execute integration code generated in accordance with the present disclosure. In this manner, different applications may obtain and execute/utilize the code in different environments. Thus, the device that utilizes the integration code need not be limited to a client devices, but may instead be a server of the entity that generated the integration code or even a third party entity. For example, the integration code may be retrieved and executed in a headless browser application running on a distributed server hosted by a service provider that generated the integration code.

As another example, sets of integration code for one or more interface providers may be executed in a batch process on a backend server of an entity that generated the integration code. For example, if an individual has bookmarked 20 books to reserve, and those 20 books are distributed among eight different libraries each associated with different integration code, the individual may select a "Reserve All" control object from an interface on the individual's client device to cause the client device to send a request to a backend server to cause the backend server to execute the sets of integration code corresponding to the eight different libraries in order to reserve the bookmarked books at their respective library.

Note that in the context of describing disclosed embodiments, unless otherwise specified, use of expressions regarding executable instructions (also referred to as code, applications, agents, etc.) performing operations that "instructions" do not ordinarily perform unaided (e.g., transmission of data, calculations, etc.) denotes that the instructions are being executed by a machine, thereby causing the machine to perform the specified operations.

Figure 13:
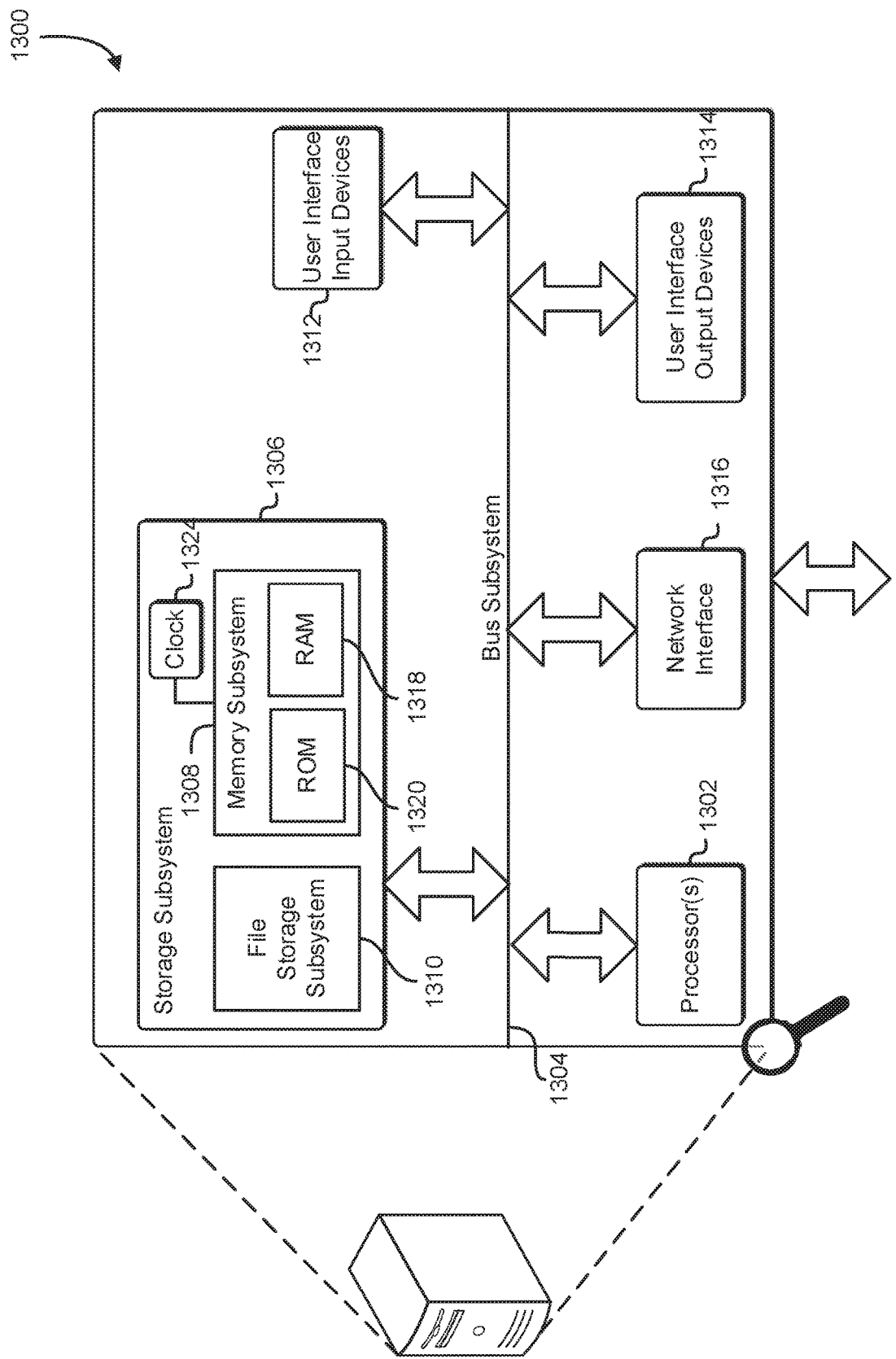
FIG. 13 illustrates a computing device that may be used in accordance with at least one embodiment.

FIG. 13 is an illustrative, simplified block diagram of a computing device 1300 that can be used to practice at least one embodiment of the present disclosure. In various embodiments, the computing device 1300 includes any appropriate device operable to send and/or receive requests, messages, or information over an appropriate network and convey information back to a user of the device. The computing device 1300 may be used to implement any of the systems illustrated and described above. For example, the computing device 1300 may be configured for use as a data server, a web server, a portable computing device, a personal computer, a cellular or other mobile phone, a handheld messaging device, a laptop computer, a tablet computer, a set-top box, a personal data assistant, an embedded computer system, an electronic book reader, or any electronic computing device. The computing device 1300 may be implemented as a hardware device, a virtual computer system, or one or more programming modules executed on a computer system, and/or as another device configured with hardware and/or software to receive and respond to communications (e.g., web service application programming interface (API) requests) over a network.

As shown in FIG. 13, the computing device 1300 may include one or more processors 1302 that, in embodiments, communicate with and are operatively coupled to a number of peripheral subsystems via a bus subsystem. In some embodiments, these peripheral subsystems include a storage subsystem 1306, comprising a memory subsystem 1308 and a file/disk storage subsystem 1310, one or more user interface input devices 1312, one or more user interface output devices 1314, and a network interface subsystem 1316. Such storage subsystem 1306 may be used for temporary or long-term storage of information.

In some embodiments, the bus subsystem 1304 may provide a mechanism for enabling the various components and subsystems of computing device 1300 to communicate with each other as intended. Although the bus subsystem 1304 is shown schematically as a single bus, alternative embodiments of the bus subsystem utilize multiple buses. The network interface subsystem 1316 may provide an interface to other computing devices and networks. The network interface subsystem 1316 may serve as an interface for receiving data from and transmitting data to other systems from the computing device 1300. In some embodiments, the bus subsystem 1304 is utilized for communicating data such as details, search terms, and so on. In an embodiment, the network interface subsystem 1316 may communicate via any appropriate network that would be familiar to those skilled in the art for supporting communications using any of a variety of commercially available protocols, such as Transmission Control Protocol/Internet Protocol (TCP/IP), User Datagram Protocol (UDP), protocols operating in various layers of the Open System Interconnection (OSI) model, File Transfer Protocol (FTP), Universal Plug and Play (UpnP), Network File System (NFS), Common Internet File System (CIFS), and other protocols.

The network, in an embodiment, is a local area network, a wide-area network, a virtual private network, the Internet, an intranet, an extranet, a public switched telephone network, a cellular network, an infrared network, a wireless network, a satellite network, or any other such network and/or combination thereof, and components used for such a system may depend at least in part upon the type of network and/or system selected. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode (ATM) and Frame Relay are unreliable connection-oriented protocols. Connection-oriented protocols are in contrast to packet-oriented protocols such as UDP that transmit packets without a guaranteed ordering. Many protocols and components for communicating via such a network are well known and will not be discussed in detail. In an embodiment, communication via the network interface subsystem 1316 is enabled by wired and/or wireless connections and combinations thereof.

In some embodiments, the user interface input devices 1312 includes one or more user input devices such as a keyboard; pointing devices such as an integrated mouse, trackball, touchpad, or graphics tablet; a scanner; a barcode scanner; a touch screen incorporated into the display; audio input devices such as voice recognition systems, microphones; image sensors or other digital image capture devices, and other types of input devices. In general, use of the term "input device" is intended to include all possible types of devices and mechanisms for inputting information to the computing device 1300. In some embodiments, the one or more user interface output devices 1314 include a display subsystem, a printer, or non-visual displays such as audio output devices, etc. In some embodiments, the display subsystem includes a cathode ray tube (CRT), a flat-panel device such as a liquid crystal display (LCD), light emitting diode (LED) display, or a projection or other display device. In general, use of the term "output device" is intended to include all possible types of devices and mechanisms for outputting information from the computing device 1300. The one or more user interface output devices 1314 can be used, for example, to present user interfaces to facilitate user interaction with applications performing processes described and variations therein, when such interaction may be appropriate.

In some embodiments, the storage subsystem 1306 provides a computer-readable storage medium for storing thereon the basic programming and data constructs that provide the functionality of at least one embodiment of the present disclosure. The applications (software programs, code modules, executable instructions), when executed by one or more processors in some embodiments, provide the functionality of one or more embodiments of the present disclosure and, in embodiments, are stored in the storage subsystem 1306. These application modules or executable instructions can be executed by the one or more processors 1302. In various embodiments, the storage subsystem 1306 additionally provides a repository for storing thereon data used in accordance with the present disclosure. In some embodiments, the storage subsystem 1306 comprises a memory subsystem 1308 and a file/disk storage subsystem 1310.

In embodiments, the memory subsystem 1308 includes a number of memories, such as a main random access memory (RAM) 1318 for storage of executable instructions and data during software program execution and/or a read only memory (ROM) 1320, in which fixed executable instructions can be stored. In some embodiments, the file/disk storage subsystem 1310 provides a non-transitory persistent (non-volatile) storage for software program and data files and can include a hard disk drive, a floppy disk drive along with associated removable media, a Compact Disk Read Only Memory (CD-ROM) drive, an optical drive, removable media cartridges, or other like storage media.

In some embodiments, the computing device 1300 includes at least one local clock 1324. The at least one local clock 1324, in some embodiments, is a counter that represents the number of ticks that have transpired from a particular starting date and, in some embodiments, is located integrally within the computing device 1300. In various embodiments, the at least one local clock 1324 is used to synchronize data transfers in the processors for the computing device 1300 and the subsystems included therein at specific clock pulses and can be used to coordinate synchronous operations between the computing device 1300 and other systems in a data center. In another embodiment, the local clock is a programmable interval timer.

The computing device 1300 could be of any of a variety of types, including a portable computer device, tablet computer, a workstation, or any other device described below. Additionally, the computing device 1300 can include another device that, in some embodiments, can be connected to the computing device 1300 through one or more ports (e.g., USB, a headphone jack, Lightning connector, etc.). In embodiments, such a device includes a port that accepts a fiber-optic connector. Accordingly, in some embodiments, this device is that converts optical signals to electrical signals that are transmitted through the port connecting the device to the computing device 1300 for processing. Due to the ever-changing nature of computers and networks, the description of the computing device 1300 depicted in FIG. 13 is intended only as a specific example for purposes of illustrating the preferred embodiment of the device. Many other configurations having more or fewer components than the system depicted in FIG. 13 are possible.

The specification and drawings are, accordingly, to be regarded in an illustrative rather than a restrictive sense. However, it will be evident that various modifications and changes may be made thereunto without departing from the scope of the invention as set forth in the claims. Likewise, other variations are within the scope of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed but, on the contrary, the intention is to cover all modifications, alternative constructions and equivalents falling within the scope of the invention, as defined in the appended claims.

In some embodiments, data may be stored in a data store (not depicted). In some examples, a "data store" refers to any device or combination of devices capable of storing, accessing, and retrieving data, which may include any combination and number of data servers, databases, data storage devices, and data storage media, in any standard, distributed, virtual, or clustered system. A data store, in an embodiment, communicates with block-level and/or object level interfaces. The computing device 1300 may include any appropriate hardware, software and firmware for integrating with a data store as needed to execute aspects of one or more applications for the computing device 1300 to handle some or all of the data access and business logic for the one or more applications. The data store, in an embodiment, includes several separate data tables, databases, data records, data files, dynamic data storage schemes, and/or other data storage mechanisms and media for storing thereon data relating to a particular aspect of the present disclosure. In an embodiment, the computing device 1300 includes a variety of data stores and other memory and storage media as discussed above. These can reside in a variety of locations, such as on a storage medium local to (and/or resident in) one or more of the computers or remote from any or all of the computers across a network. In an embodiment, the information resides in a storage-area network (SAN) familiar to those skilled in the art, and, similarly, any necessary files for performing the functions attributed to the computers, servers or other network devices are stored locally and/or remotely, as appropriate.

In an embodiment, the computing device 1300 may provide access to data including, but not limited to, text, graphics, audio, video, and/or other data that is provided to a user in the form of Hypertext Markup Language (HTML), Extensible Markup Language (XML), JavaScript, Cascading Style Sheets (CSS), JavaScript Object Notation (JSON), and/or another appropriate language. The computing device 1300 may provide the data in one or more forms including, but not limited to, forms that are perceptible to the user audibly, visually, and/or through other senses. The handling of requests and responses, as well as the delivery of data, in an embodiment, is handled by the computing device 1300 using PHP: Hypertext Preprocessor (PHP), Python, Ruby, Perl, Java, HTML, XML, JSON, and/or another appropriate language in this example. In an embodiment, operations described as being performed by a single device are performed collectively by multiple devices that form a distributed and/or virtual system.

In an embodiment, the computing device 1300 typically will include an operating system that provides executable software program instructions for the general administration and operation of the computing device 1300 and includes a computer-readable storage medium (e.g., a hard disk, random access memory (RAM), read only memory (ROM), etc.) storing thereon executable instructions that if executed (e.g., as a result of being executed) by a processor of the computing device 1300 cause or otherwise allow the computing device 1300 to perform its intended functions (e.g., the functions are performed as a result of one or more processors of the computing device 1300 executing instructions stored on a computer-readable storage medium).

In an embodiment, the computing device 1300 operates as a web server that runs one or more of a variety of server or mid-tier applications, including Hypertext Transfer Protocol (HTTP) servers, FTP servers, Common Gateway Interface (CGI) servers, data servers, Java servers, Apache servers, and business application servers. In an embodiment, computing device 1300 is also capable of executing software programs or scripts in response to requests from user devices, such as by executing one or more web applications that are implemented as one or more scripts or software programs written in any programming language, such as Java®, C, C # or C++, or any scripting language, such as Ruby, PHP, Perl, Python, or TCL, as well as combinations thereof. In an embodiment, the computing device 1300 is capable of storing, retrieving, and accessing structured or unstructured data. In an embodiment, computing device 1300 additionally or alternatively implements a database, such as one of those commercially available from Oracle®, Microsoft®, Sybase®, and IBM® as well as open-source servers such as MySQL, Postgres, SQLite, MongoDB. In an embodiment, the database includes table-based servers, document-based servers, unstructured servers, relational servers, non-relational servers, or combinations of these and/or other database servers.

The use of the terms "a" and "an" and "the" and similar referents in the context of describing the disclosed embodiments (especially in the context of the following claims) is to be construed to cover both the singular and the plural, unless otherwise indicated or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values in the present disclosure are merely intended to serve as a shorthand method of referring individually to each separate value falling within the range unless otherwise indicated and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., could be either A or B or C, or any nonempty subset of the set of A and B and C. For instance, in the illustrative example of a set having three members, the conjunctive phrases "at least one of A, B, and C" and "at least one of A, B, and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described can be performed in any suitable order unless otherwise indicated or otherwise clearly contradicted by context. Processes described (or variations and/or combinations thereof) can be performed under the control of one or more computer systems configured with executable instructions and can be implemented as code (e.g., executable instructions, one or more computer software programs or one or more applications) executing collectively on one or more processors, by hardware or combinations thereof. In some embodiments, the code can be stored on a computer-readable storage medium, for example, in the form of a computer software program comprising a plurality of instructions executable by one or more processors. In some embodiments, the computer-readable storage medium is non-transitory.

The use of any and all examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments will become apparent to those of ordinary skill in the art upon reading the foregoing description. The inventors expect skilled artisans to employ such variations as appropriate and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A computer implemented method performed by one or more servers of a first provider, comprising:
    for a second provider that hosts a first user interface and a second user interface accessible via the Internet, accessing the first user interface via the Internet, wherein:
        the second provider is independent from the first provider; and
        each of the first user interface and the second user interface is a web page or other transactional user interface;
    determining which of a plurality of button objects in the first user interface is a first button object that causes an item associated with the first button object to appear in the second user interface, at least by:
        determining, from the plurality of button objects, a set of candidate first button objects in the first user interface, the set of candidate first button objects associated with a set of candidate items for the item;
        determining, from the plurality of button objects, a set of candidate second button objects in the first user interface;
        executing, by performing simulated human interaction with the set of candidate second button objects, a set of candidate second user interfaces of the second provider;
        storing a set of respective initial states of the set of candidate second user interfaces;
        for each candidate first button object of the set of candidate first button objects:
            performing the simulated human interaction with the candidate first button object;
            refreshing the set of candidate second user interfaces;
            for each candidate second user interface of the set of candidate second user interfaces, modifying candidate rankings of the candidate first button object and the candidate second user interface based on whether a difference between a respective initial state of the candidate second user interface and a current state of the candidate second user interface has a correlation to a candidate item in the set of candidate items associated with the candidate first button object; and
        based on the candidate rankings, determining:
            the first button object from the set of candidate first button objects;
            the second user interface from the set of candidate second user interfaces; and
            a second button object of the set of candidate second button objects that executed the second user interface; obtaining metadata of the first button object, the second user interface, and the second button object;
    generating, based on the metadata, integration code that, as a result of execution of the integration code by a client device, causes the client device to add another item from another first user interface of the second provider to the second user interface in response to user interaction with an interface object displayed on the client device, wherein adding the other item to the second user interface facilitates a transaction between a user of the client device and the second provider; and
    providing the integration code to the client device to cause the client device to add the item by causing the client device to:
        access the other first user interface;
        identify, within the other first user interface, another first button object and another second button object, the other first button object associated with the item; and
        perform the simulated human interaction with the other first button object.

2. The computer implemented method of claim 1, wherein the correlation to the candidate item is a value of the candidate item increased at least by an amount associated with a geographic region associated with the client device.

3. The computer implemented method of claim 1, wherein:
the computer implemented method further comprises providing, to the client device, an application that includes at least one interface object; and
the client device, as a result of execution of the application, executes the integration code in response to interaction with the at least one interface object.

4. The computer implemented method of claim 1, further comprising:
determining an additional interface object in the first user interface; and
prior to performing the simulated human interaction with the first candidate button object, performing the simulated human interaction with the additional interface object.

5. A system of a first provider, comprising:
one or more processors; and
memory including executable instructions that, if executed by the one or more processors, cause the system to:
for a second provider that hosts a first interface and a second interface accessible via the Internet, access the first interface via the Internet, wherein:
the second provider is independent from the first provider; and
the first interface and the second interface are ones of a web page or other transactional user interface;
determine a set of first candidate control objects in the first interface;
determine a set of second candidate control objects in the first interface, the set of second candidate control objects associated with a set of candidate items;
perform simulated human interaction with the set of first candidate control objects to execute a set of candidate second interfaces of the second provider;
for each second control object of the set of second candidate control objects:
perform the simulated human interaction with the second candidate control object;
refresh the set of candidate second interfaces; and
for each candidate second interface of the set of candidate second interfaces, if a difference between an initial state and a current state of the candidate second interface has a correlation to a candidate item in the set of candidate items associated with the second candidate control object, modify rankings of the second candidate control object;
based on the rankings, determine:
the second control object from the set of second candidate control objects; and
the second interface from the set of candidate second interfaces;
generate, meta data of the second control object and the second interface, integration code that, as a result of execution by a client device, causes the client device to add an item from another first user interface of the second provider to the second interface in response to user interaction with an interface object displayed on the client device, wherein adding the other item to the second interface facilitates a transaction between a user of the client device and the second provider; and provide the integration code to the client device to cause the client device to:
access a notherfirst interface with another second control object; and
perform the simulated human interaction with the other second control object to add the item to the second interface.

6. The system of claim 5, wherein the correlation to the candidate item is a value of the candidate item modified at least by an amount associated with a geographic region associated withthe client device.

7. The system of claim 5, wherein:
the executable instructions further include instructions that further cause the system to provide, to the client device, an application that includes at least one interface object; and
the client device, as a result of execution of the application, executes the integration code in response to interaction with the at least one interface object.

8. The system of claim 5, wherein the executable instructions further include instructions that further cause the system to:
determine an additional interface object in the first interface; and
perform the simulated human interaction with the additional interface object priorto causing the system to perform the simulated human interaction with the second control object.

9. A non-transitory computer readable storage medium storing thereon executable instructions that, if executed by one or more processors of a computer system of a first provider, cause the computer system to at least:
for a second provider, independent from the first provider, that hosts a first user interface and a second user interface accessible via the Internet, access the first user interface via the Internet, wherein each of the first user interface and the second user interface is a web page or other transactional user interface;
identify a first button object in the first user interface that causes an item associated with the first button object to appear in the second user interface, at least by causing the computer system to:
determine a set of first candidate button objects in the first user interface, the set of first candidate button objects associated with a set of candidate items for the item;
determine a set of second candidate button objects in the first user interface;
execute, by performing simulated human interaction with the set of candidate second button objects, a set of candidate second user interfaces of the second provider;
for each candidate first button object of the set of candidate first button objects:
perform the simulated human interaction with the candidate first button object;
refresh the set of candidate second user interfaces; and
for each candidate second user interface of the set of candidate second user interfaces, increase candidate rankings of the candidate first button object and the candidate second user interface if a difference between an initial state and a current state of the candidate second user interface has a correlation to a candidate item in the set of candidate items associated with the candidate first button object;

based on the candidate rankings, determining:
  the first button object from the set of candidate first button objects; and the second user interface from the set of candidate second user interfaces;
obtain metadata of the first button object and the second user interface;
generate, based on the metadata, integration code that, as a result of execution by a client device, causes the client device to add another item from another first user interface of the second provider to the second user interface in response to user interaction with an interface object displayed on the client device, wherein adding the other item to the second user interface facilitates a transaction between a user of the client device and the second provider; and
provide the integration code to the client device to cause the client device to:
  access the other first user interface;
  identify, within the other first user interface, another first button object and another second button object, the other first button object associated with the other item; and
  perform the simulated human interaction with the other first button object.

10. The non-transitory computer readable storage medium of claim 9, wherein the correlation to the candidate item is a value of the candidate item increased at least by an amount associated with a geographic region associated with the client device.

11. The non-transitory computer readable storage medium of claim 9, wherein:
  the executable instructions further include instructions that further cause the computer system to provide, to the client device, an application that includes at least one interface object; and
  the client device, as a result of execution of the application, executes the integration code in response to interaction with the at least one interface object.

12. The non-transitory computer readable storage medium of claim 9, wherein the executable instructions further include instructions that further cause the computer system to:
  determine an additional interface object in the first user interface; and
  perform the simulated human interaction with the additional interface object prior to causing the computer system to perform the simulated human interaction with the candidate first button object.

* * * * *